(12) United States Patent
Zucker et al.

(10) Patent No.: US 11,508,560 B2
(45) Date of Patent: Nov. 22, 2022

(54) FOCUS RING ADJUSTMENT ASSEMBLY OF A SYSTEM FOR PROCESSING WORKPIECES UNDER VACUUM

(71) Applicants: Mattson Technology, Inc., Fremont, CA (US); Beijing E-Town Semiconductor Technology Co., Ltd., Beijing (CN)

(72) Inventors: Martin L. Zucker, Orinda, CA (US); Peter J. Lembesis, Boulder Creek, CA (US); Ryan M. Pakulski, Brentwood, CA (US); Shawming Ma, Sunnyvale, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

(21) Appl. No.: 15/930,910

(22) Filed: May 13, 2020

(65) Prior Publication Data
US 2020/0365405 A1 Nov. 19, 2020

Related U.S. Application Data

(60) Provisional application No. 62/847,595, filed on May 14, 2019.

(51) Int. Cl.
*H01L 21/20* (2006.01)
*H01J 37/32* (2006.01)
(Continued)

(52) U.S. Cl.
CPC ..... *H01J 37/32642* (2013.01); *B25J 11/0095* (2013.01); *B25J 15/0014* (2013.01);
(Continued)

(58) Field of Classification Search
CPC ............... H01J 37/32642; H01J 37/321; H01J 37/32568; H01J 37/32715;
(Continued)

(56) References Cited

U.S. PATENT DOCUMENTS 5,376,862 A 12/1994 Stevens
5,380,137 A 1/1995 Wada
(Continued)

FOREIGN PATENT DOCUMENTS

| CN | 105575863 A | 5/2016 |
|---|---|---|
| KR | 10-2011-0080811 A | 7/2011 |
| KR | 10-2017-0014384 A | 2/2017 |

OTHER PUBLICATIONS

PCT International Search Report and Written Opinion for corresponding PCT Application No. PCT/US2020/032601, dated Aug. 26, 2020, 15 pages.
(Continued)

*Primary Examiner* — Mohammed Shamsuzzaman
(74) *Attorney, Agent, or Firm* — Dority & Manning, P.A.

(57) ABSTRACT

A focus ring adjustment assembly of a system for processing workpieces under vacuum, where the focus ring may include a lower side having a first surface portion and a second surface portion, the first surface portion being vertically above the second surface portion. The adjustment assembly may include a pin configured to selectively contact the first surface portion of the focus ring, and an actuator operable to move the pin along the vertical direction between an extended position and a retracted position. The extended position of the pin may be associated with the distal end of the pin contacting the first surface of the focus ring and the focus ring being accessible for removal by a workpiece handling robot from the vacuum process chamber.

13 Claims, 21 Drawing Sheets

(51) Int. Cl.
| | |
|---|---|
| *H01L 21/203* | (2006.01) |
| *H01L 21/677* | (2006.01) |
| *H01L 21/68* | (2006.01) |
| *B25J 11/00* | (2006.01) |
| *B25J 15/00* | (2006.01) |
| *H01L 21/67* | (2006.01) |
| *H01L 21/683* | (2006.01) |
| *H01L 21/687* | (2006.01) |

(52) U.S. Cl.
CPC ...... *H01J 37/321* (2013.01); *H01J 37/32568* (2013.01); *H01J 37/32715* (2013.01); *H01J 37/32733* (2013.01); *H01J 37/32743* (2013.01); *H01J 37/32807* (2013.01); *H01J 37/32899* (2013.01); *H01L 21/203* (2013.01); *H01L 21/67069* (2013.01); *H01L 21/67167* (2013.01); *H01L 21/67196* (2013.01); *H01L 21/67201* (2013.01); *H01L 21/67745* (2013.01); *H01L 21/67766* (2013.01); *H01L 21/681* (2013.01); *H01L 21/6831* (2013.01); *H01L 21/68707* (2013.01); *H01L 21/68742* (2013.01); *H01J 2237/2007* (2013.01); *H01J 2237/334* (2013.01); *H01L 21/67742* (2013.01)

(58) Field of Classification Search
CPC ........... H01J 37/32733; H01J 37/32743; H01J 37/32807; H01J 37/32899; H01J 2237/2007; H01J 2237/334; H01J 37/32082; B25J 11/0095; B25J 15/0014; H01L 21/203; H01L 21/67069; H01L 21/67167; H01L 21/67196; H01L 21/67201; H01L 21/67745; H01L 21/67766; H01L 21/681; H01L 21/6831; H01L 21/68707; H01L 21/67742; H01L 21/67184; H01L 21/68742

See application file for complete search history.

(56) References Cited

U.S. PATENT DOCUMENTS

| | | | |
|---|---|---|---|
| 5,909,994 | A | 6/1999 | Blum et al. |
| 6,450,750 | B1 | 9/2002 | Heyder |
| 7,654,596 | B2 | 2/2010 | Mantz |
| 7,959,403 | B2 | 6/2011 | Van der Meulen |
| 8,430,620 | B1 | 4/2013 | Blank |
| 9,202,733 | B2 | 12/2015 | Hosek |
| 9,757,865 | B1 | 9/2017 | Chen |
| 9,881,820 | B2 | 1/2018 | Wong et al. |
| 9,881,821 | B2 | 1/2018 | Hung et al. |
| 10,062,589 | B2 | 8/2018 | Wong et al. |
| 10,062,590 | B2 | 8/2018 | Wong et al. |
| 10,062,599 | B2 | 8/2018 | Genetti et al. |
| 10,109,515 | B2 | 10/2018 | Kanazawa |
| 10,124,492 | B2 | 11/2018 | Genetti et al. |
| 10,204,810 | B2 | 2/2019 | Hoey |
| 10,490,392 | B2 * | 11/2019 | Ishizawa ........... H01J 37/32642 |
| 10,580,672 | B2 | 3/2020 | Yang et al. |
| 10,699,878 | B2 | 6/2020 | Caron et al. |
| 10,964,584 | B2 * | 3/2021 | Volfovski .......... H01L 21/67745 |
| 11,211,269 | B2 * | 12/2021 | Harbert ............ H01L 21/67772 |
| 2001/0016157 | A1 | 8/2001 | Sundar |
| 2003/0123971 | A1 | 7/2003 | Koyama |
| 2004/0027781 | A1 | 2/2004 | Hanawa et al. |
| 2004/0113444 | A1 | 6/2004 | Blonigan et al. |
| 2004/0242126 | A1 | 12/2004 | Takeuchi |
| 2005/0005847 | A1 | 1/2005 | Hiroki |
| 2005/0111956 | A1 | 5/2005 | Van der Meulen |
| 2005/0205209 | A1 * | 9/2005 | Mosden ........... H01L 21/67069 156/345.31 |
| 2006/0039781 | A1 | 2/2006 | Niewmierzycki et al. |
| 2006/0045664 | A1 | 3/2006 | Niewmierzycki et al. |
| 2006/0182529 | A1 | 8/2006 | Hiroki |
| 2008/0008569 | A1 | 1/2008 | Seol |
| 2008/0105201 | A1 | 5/2008 | Ronan |
| 2008/0175694 | A1 | 7/2008 | Park |
| 2009/0191030 | A1 | 7/2009 | Bluck et al. |
| 2009/0209112 | A1 * | 8/2009 | Koelmel ........... H01L 21/67115 438/795 |
| 2012/0049555 | A1 | 3/2012 | Fujii et al. |
| 2013/0135784 | A1 | 5/2013 | Kao et al. |
| 2014/0213055 | A1 | 7/2014 | Himori et al. |
| 2014/0271054 | A1 | 9/2014 | Weaver |
| 2015/0098790 | A1 | 4/2015 | Wakabayashi |
| 2016/0293467 | A1 * | 10/2016 | Caveney ........... H01L 21/67259 |
| 2017/0053820 | A1 | 2/2017 | Bosch et al. |
| 2017/0057094 | A1 | 3/2017 | Nishino |
| 2017/0115657 | A1 | 4/2017 | Trussell et al. |
| 2017/0117172 | A1 * | 4/2017 | Genetti ............ H01L 21/67201 |
| 2017/0330786 | A1 | 11/2017 | Genetti et al. |
| 2017/0334074 | A1 * | 11/2017 | Genetti ................ B25J 11/0095 |
| 2018/0068879 | A1 * | 3/2018 | Wong ............... H01L 21/67303 |
| 2018/0082881 | A1 | 3/2018 | Nagakubo |
| 2018/0108548 | A1 * | 4/2018 | Yang ................ H01L 21/67742 |
| 2018/0166295 | A1 | 6/2018 | Huang et al. |
| 2018/0332062 | A1 | 11/2018 | Ford |
| 2020/0098550 | A1 | 3/2020 | Takahashi et al. |

OTHER PUBLICATIONS

USPTO Non-Final Office Action for U.S. Appl. No. 15/930,874, dated Dec. 22, 2021, 19 pages.
USPTO Notice of Allowance for U.S. Appl. No. 15/930,874, dated Mar. 3, 2022, 10 pages.
USPTO Non-Final Office Action for U.S. Appl. No. 15/930,910, dated Feb. 1, 2022, 14 pages.
USPTO Notice of Allowance for U.S. Appl. No. 15/930,910, dated Mar. 3, 2022, 14 pages.
USPTO Non-Final Office Action for U.S. Appl. No. 15/930,924, dated Apr. 26, 2022, 15 pages.
USPTO Notice of Allowance for U.S. Appl. No. 15/930,924, dated Mar. 3, 2022, 8 pages.
USPTO Non-Final Office Action for U.S. Appl. No. 15/930,943, dated Oct. 7, 2021, 10 pages.

* cited by examiner

FOCUS RING ADJUSTMENT ASSEMBLY OF A SYSTEM FOR PROCESSING WORKPIECES UNDER VACUUM

PRIORITY CLAIM

The present application claims the benefit of priority of U.S. Provisional Application Ser. No. 62/847,595, titled "SYSTEMS AND METHODS FOR TRANSPORTATION OF REPLACEABLE PARTS IN A VACUUM PROCESSING APPARATUS," filed on May 14, 2019, which is incorporated herein by reference.

FIELD

The present disclosure relates generally to processing workpieces and more particularly to a focus ring adjustment assembly of a system for processing workpieces, such as semiconductor workpieces, under vacuum.

BACKGROUND

Processing systems which expose workpieces such as, semiconductor wafers or other suitable substrates, to an overall treatment regimen for forming semiconductor devices or other devices can perform a plurality of treatment steps, such as plasma processing (e.g., strip, etch, etc.), thermal treatment (e.g. annealing), deposition (e.g., chemical vapor deposition), etc. To carry out these treatment steps, a system may include one or more robots to move workpieces a. number of different times, for example, into the system, between various processing chambers, and out of the system. In semiconductor workpiece processing, it can be necessary from time to time to perform routine maintenance and/or preventative maintenance on processing systems. This can require, in certain instances, physical replacement of certain parts in the processing systems.

SUMMARY

Aspects and advantages of embodiments of the present disclosure will be set forth in prat in the following description, or may be learned from the description, or may be learned through practice of the invention.

One example embodiment of the present disclosure is directed to a focus ring adjustment assembly of a system for processing workpieces under vacuum, where the focus ring extends along a vertical direction between an upper side and a lower side, the lower side having a first surface portion and a second surface portion and the first surface portion being vertically above the second surface portion. The focus ring adjustment assembly includes a pin extending between a proximal end and a distal end, with the distal end being configured to selectively contact the first surface portion of the focus ring. The focus ring adjustment assembly further includes an actuator operable to move the pin along the vertical direction between an extended position and a retracted position. The extended position of the pin is associated with the distal end of the pin contacting the first surface of the focus ring, and the focus ring being accessible for removal by a workpiece handling robot from the vacuum process chamber.

Other example aspects are directed to systems and methods for processing a workpiece. Variations and modifications can be made to example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
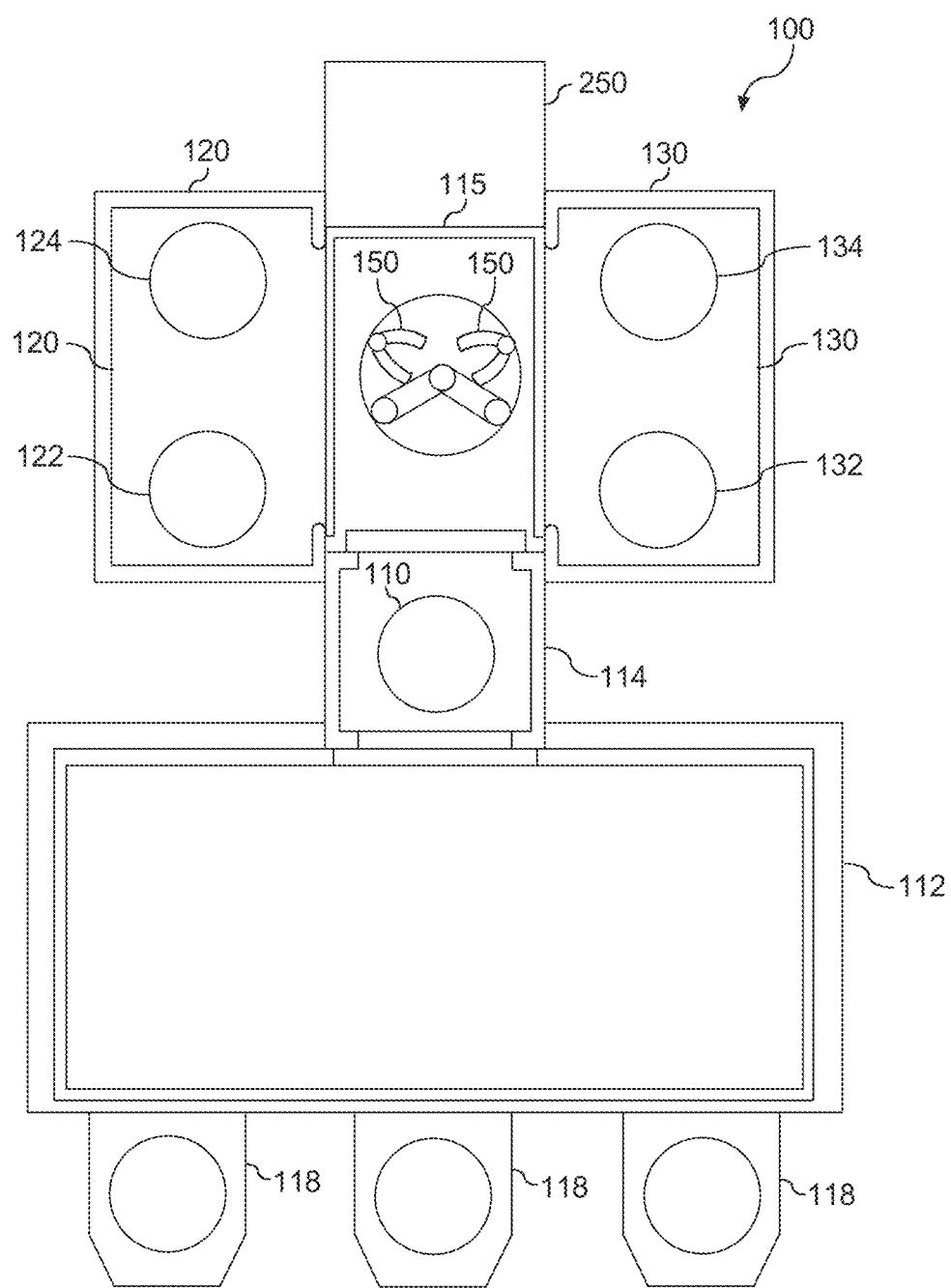
FIG. 1 depicts a plan view of an example processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to systems and methods for automated replacement of replaceable parts in semiconductor workpiece processing equipment. The systems and methods can provide for manipulating the replaceable parts through a vacuum apparatus. Example replaceable parts can include focus rings used in plasma processing chambers (e.g., plasma dry etch chambers) for semiconductor workpieces.

In workpiece processing systems, preventative maintenance can be performed by trained technicians that perform physical acts of labor to replace replaceable parts, such as focus rings in plasma dry etch chambers. In vacuum processing systems, this can require venting of the processing chambers to atmosphere and opening of the processing chambers for access. This can lead to expensive downtime in semiconductor device manufacturing processes. In addition, when a processing chamber is open to the environment, the potential contamination of other processing parts has increased risk and other chamber parts can need to be removed and/or replaced.

For instance, a process for performing maintenance on semiconductor processing equipment has included monitoring for a trigger condition, such as workpiece count, plasma exposure time (e.g., for a plasma processing tool), etc. Upon occurrence of a trigger condition, a vacuum processing chamber can be taken offline, reducing workpiece throughput. A service technician can implement processing chamber conditioning (e.g., plasma cleaning) to put the vacuum processing chamber in a safe opening state. After conditioning, the technician can vent the vacuum processing chamber. The technician can open the vacuum processing chamber to access the interior and start removal of certain chamber parts (e.g., focus rings). After cleaning of any unremoved parts, replacement parts can be added to the processing chamber and the vacuum processing chamber can be closed and evacuated. Once back online, some qualification workpieces can be run through the vacuum processing chamber. Once the vacuum processing chamber is producing a successful result, the processing chamber can be put back into semiconductor device production.

According to example aspects of the present disclosure, workpiece processing equipment can be configured to automatically replace certain process chamber parts through robotics that are typically found in workpiece processing equipment. More particularly, unused replaceable parts can be loaded into a storage area and made accessible to the vacuum transport robotics. The robotics can interface with a workpiece processing module to remove a consumed (used) chamber part and then replace it with a new (non-consumed) chamber part. The used part can then be returned to the storage area where it can be removed without the need to disrupt the workpiece processing chamber.

In some embodiments, after placement of the new (non-consumed) chamber part, robotics can access a test workpiece (e.g., dummy wafer stored in the storage area (e.g., on a shelf in the storage area). The robotics can transfer the workpiece to the processing module and perform at test process. The systems can perform measurements to make sure the new chamber part has been placed correctly. In addition and/or in the alternative, various sensors (e.g., optical sensors) can perform measurements relating to position of the new chamber part to make sure it has been positioned correctly. In some embodiments, an automated wafer centering system can be used to adjust the motion of robotics in placing the new (non-consumed) part in the processing module to ensure proper placement.

In some embodiments, the systems and methods according to example aspects of the present disclosure can be used to replace focus rings used in plasma processing chambers. A focus ring can be positioned around a periphery of a workpiece supported on a workpiece support (e.g., having cathode or bias electrode) in a plasma processing apparatus. The focus ring can be used, for instance, to shape the plasma in the vicinity of the workpiece. During plasma processing in a plasma processing chamber, the focus ring can be exposed to plasma and as such is exposed to deposition and erosion. As a result, focus rings may need to be periodically replaced in plasma processing chambers as part of preventative maintenance for a workpiece processing system.

Aspects of the present disclosure are discussed with reference to a focus ring as a replaceable part. Those of ordinary skill in the art, using the disclosures provided herein, will understand that aspects of the present disclosure are applicable for replacing other replaceable parts in a vacuum processing chamber without deviating from the scope of the present disclosure.

In some embodiments, the systems can monitor for a trigger condition, such as a workpiece count, plasma exposure time, etc. Upon occurrence of the trigger condition, an in-situ plasma dry clean process can be implemented to prepare the vacuum processing chamber. Once the in-situ plasma dry clean process is complete, a lift mechanism outside of the vacuum processing chamber but coupled inside the chamber can use a set of pins to lift a focus ring that sits around a workpiece support in the vacuum processing chamber. After lifting the focus ring, a workpiece handling robot can enter the chamber and lift the ring off the pins in a vertical motion. The robot can retract and rotate to place the used focus ring on a shelf in a storage location. In some embodiments, the workpiece handling robot can hand off the focus ring to a second robot for placement into a storage location.

The robot can then move to a different shelf of the storage location and retrieve a new focus ring. After rotation to the vacuum processing module, the robot can extend to the needed position and the drop down to place the focus ring on the lift pins. After the robot retracts from the vacuum processing module, the system can lower the lifting pins and drop the ring into final position around the workpiece support (e.g., including cathode). A conditioning plasma can be used to stabilize process performance in the workpiece processing chamber and the vacuum processing chamber can be brought back online for normal operation. A test workpiece (e.g., obtained from the storage location) can be used to test the processing module with a test process prior to bringing the process module back online for normal operation.

Example aspects of the present disclosure also include workpiece handling robots capable of accessing one or more of the side-by-side processing stations according to a particular robotic arm motion pattern. Specifically, the robotic arm motion pattern allows for the end effector of the workpiece handling robot to enter a process chamber having side-by-side processing stations and then access one of the processing stations so as to transfer workpieces or replaceable parts from the processing station. The robotic arm motion pattern can include moving the end effector according to a first direction for a first period of time, moving the end effector according to a second direction that is generally lateral to the first direction for a second period of time, and moving the end effector according to a third direction that is different from the first or second direction for a third period of time. The end effector can be moved according to the robotic arm motion pattern to access the processing station and can also be retracted from the processing station according to the same motion. In some embodiments, the robotic motion can be automatically controlled and/or adjusted in real time using sensors as part of, for instance, an automated wafer centering system (e.g., optical sensors) to ensure proper placement of the replaceable parts in the processing station.

According to example aspects of the present disclosure, robotics used to transfer workpieces as part of a workpiece processing system can be adapted to transfer replaceable parts (e.g., focus rings) according to example embodiments of the present disclosure. For instance, the robotic end effector can have a spatula design to accommodate workpiece support pads and replaceable part support pads for supporting semiconductor workpieces and replaceable parts. The end effectors can include at least one common support pad that is configured to support both workpieces and replaceable parts. Further, the end effectors can include at least one support pad for supporting workpieces that is positioned further from an axis of the effector and from a distal end of the effector than at least one other support pad for supporting replaceable parts.

Example aspects of the present disclosure also include a focus ring adjustment assembly for adjusting a position of a focus ring within a process chamber for removal and/or installation. Specifically, the adjustment assembly can include pins that are configured to raise a focus ring to one or more different vertical positions, for instance, to allow the focus ring to be more readily removed from the focus chamber by an end effector and to lower a new focus ring to install the focus ring around a workpiece support. The pins can be configured to contact the vertically highest portion of a lower side of the focus ring. Additionally, in some embodiments, the pins can be rotatable to lock an azimuthal position of the focus ring to assist with proper centering of the focus ring relative to the workpiece support.

The focus ring adjustment assembly can include a lift pin movable along a vertical direction to facilitate movement of a focus ring of the plasma processing apparatus to adjust a distance between the focus ring and a pedestal configured to support a substrate to be processed. In particular, the lift pin can be positioned outside of a RF zone defined by a bias electrode positioned within the pedestal, The lift pin can also penetrate a ground plane positioned within the pedestal.

Aspects of the present disclosure can provide a number of technical effects and benefits. For instance, the robotic arm motion pattern provided herein can facilitate access to replaceable parts in process chambers having multiple processing stations, such as two processing stations. Furthermore, the storage chamber provided herein allows for storage of used replaceable parts and retrieval of new replaceable parts for the process chambers without having to break the overall vacuum of the system. In some embodiments, test workpieces can be included in the storage chamber to be used in testing of replaceable parts after placement. The contact between the pins and the focus ring can prevent lateral movement of the focus ring as the focus ring is raised and lowered to ensure the focus ring is precisely concentric to the electrostatic chuck or other workpiece support. The end effector support elements provided herein can reduce total number of parts, which reduces costs, and simplifies control patterns for moving the end effector. Further, the spatial configuration of the support pads on the end effector can utilize existing openings of process chambers for moving replaceable parts into and out of process chambers. Locating the lift pin outside of the RF zone and having the lift pin penetrate the ground plane can reduce arcing risks associated with applying RF power (e.g. bias power) from a RF source to the bias electrode during a plasma process. Furthermore, there can be reduced interference (e.g., electrical and mechanical) between the lift pin and the focus ring.

One example embodiment of the present disclosure is directed to a system for processing workpieces. The system includes a front end portion configured to be maintained at atmospheric pressure. The system includes a loadlock chamber disposed between the front end portion and a vacuum portion. The system includes one or more process chambers disposed in the vacuum portion. Each process chamber can include two or more processing stations. At least one transfer chamber can be disposed in the vacuum portion. The system can includes a storage chamber configured to store one or more replaceable parts coupled to the at least one transfer chamber. The system can include one or more workpiece handling robots disposed in the at least one transfer chamber. The workpiece handling robot can be configured to move the one or more replaceable parts between the storage chamber and the one or more process chambers. The workpiece handling robot can include an end effector configured to support a replaceable part. The system can include a controller configured to control motion of the end effector according to a robotic arm motion pattern to access the processing station. The robotic arm motion pattern includes extending in a first direction for a first period of time, extending in a second direction lateral to the first direction for a second period of time, and extending in a third direction different from the first direction and second direction for a third period of time. In some embodiments, the robotic arm motion pattern includes retracting the end effector back according to the same pattern.

As used herein, a controller can include one or more control devices, such as one or more processors. The one or more processors can be configured to execute computer-readable instructions stored in one or more memory devices to send control signals to control operation of various components according to any of the functions, operations, or methods described herein.

In some embodiments, the one or more process chambers include a first process chamber and a second process chamber disposed on opposite sides of the transfer chamber. N In some embodiments, the one or more process chambers include a first process chamber and a second process chamber disposed on opposing sides of the transfer chamber. The one or more process chambers further include a third process chamber disposed in a linear arrangement with the first process chamber and a fourth process chamber disposed in a linear arrangement with the second process chamber such that the third process chamber and the fourth process chamber are disposed on opposing sides of the transfer chamber. Each of the first process chamber, second process chamber, third process chamber, and fourth process chamber can include at least two process stations. The transfer chamber can include a transfer position configured to support workpieces and replaceable parts in a stacked arrangement. In some embodiments, the stacked arrangement includes a plurality of shelves configured to house both workpieces and replaceable parts. The replaceable parts can have a larger diameter than the workpieces.

In some embodiments, the one or more workpiece handling robots can include a first workpiece handling robot and a second handling robot. The first workpiece handling robot can be configured to transfer workpieces and replaceable parts from the workpiece column, the first process chamber, the second process chamber, and the transfer position and the second workpiece handling robot configured to transfer workpieces and replaceable parts from the storage chamber, the third process chamber, the fourth process chamber, and the transfer position for automated processing of the workpieces and automated replacement of replaceable parts without breaking vacuum.

In some embodiments, the process chambers are configured to perform plasma etch processes using a direct plasma. The two or more processing stations are in side-by-side arrangement. The two or more processing stations can be associated with a workpiece support for supporting a workpiece during processing in the process chamber. The workpiece support includes a pedestal assembly comprising a baseplate, an electrostatic chuck configured to support the workpiece, a replaceable part including a focus ring arranged relative to the electrostatic chuck such that at least a portion of the focus ring at least partially surrounds a periphery of the workpiece when the workpiece is positioned on the electrostatic chuck.

In some embodiments, the replaceable part includes a focus ring having a larger diameter than the workpiece.

In some embodiments, the storage chamber includes a plurality of shelves configured to house both used and new replaceable parts.

In some embodiments, the plurality of shelves are coupled to an elevator such that the elevator is configured to move replaceable parts up and down within the storage chamber.

In some embodiments, the storage chamber is a vacuum capable storage chamber that includes one or more access doors configured to allow the workpiece robot to access replaceable parts in the storage chamber and one or more access doors configured to allow for replacement of new or used replaceable parts from the atmospheric surrounding environment.

In some embodiments, the workpiece handling robot is configured to transfer one or more replaceable parts from the storage chamber to the at least two processing stations in the process chamber using a scissor motion.

Another example embodiment of the present disclosure is directed to a system for processing workpieces. The system includes: a front end portion configured to be maintained at atmospheric pressure; a loadlock chamber disposed between the front end portion and a vacuum portion, wherein the loadlock chamber includes a workpiece column for storing workpieces; a transfer chamber disposed in the vacuum portion having a first workpiece handling robot, a second workpiece handling robot, and a transfer position configured to support workpieces and focus rings in a stacked arrangement therein; a first process chamber, second process chamber, third process chamber, and fourth process chamber, wherein the first process chamber and second process chamber are disposed on opposite sides of the transfer chamber in the vacuum portion and the third process chamber and further process chamber are disposed on opposite sides of the transfer chamber, wherein the third process chamber is in linear arrangement with the first process chamber and the fourth process chamber is in linear arrangement with the second process chamber, wherein each of the first process chamber, second process chamber, third process chamber, and fourth process chamber comprise two or more processing stations in side-by-side arrangement. The system can include storage chamber configured to store one or more focus rings coupled to the transfer chamber. The first workpiece handling robot and second workpiece handling robot each include an end effector configured to support a focus ring. The system includes a controller configured to control motion of the end effector according to a robotic arm motion pattern to access the processing station. The robotic arm motion pattern includes extending in a first direction for a first period of time, extending in a second direction lateral to the first direction for a second period of time, and extending in a third direction different from the first direction and second direction for a third period of time, and retracting back according to the same robotic arm motion pattern. The first workpiece handling robot can be configured to transfer the workpieces and one or more focus rings between the workpiece column, first process chamber, second process chamber, and transfer position and the second workpiece handling robot can be configured to transfer the workpieces and one or more focus rings between the storage chamber, third process chamber, fourth process chamber, and transfer position for automated processing of the workpieces and automated replacement of focus rings without breaking vacuum.

Another example embodiment of the present disclosure is directed to a method for replacing replaceable parts in a system for processing workpieces, the system including a transfer chamber having one or more process chambers configured thereto, wherein each of the one or more process chambers includes two or more processing stations in side-by-side arrangement, a storage chamber disposed on the transfer chamber, one or more workpiece handling robots disposed in the transfer chamber having an arm with an end effector configured thereto. The method can include: removing a used replaceable part from a processing station in a process chamber with the workpiece handling robot, including accessing the processing station according to a robotic arm motion pattern including extending the end effector in a first direction for a first period of time, extending in a second direction lateral to the first direction for a second period of time, and extending in a third direction different from the first direction and second direction for a third period of time, picking up the used replaceable part and retracting back according to the same pattern; transferring the replaceable part to a storage chamber; removing a new replaceable part from the storage chamber with the workpiece handling robot; and transferring the new replaceable part to the processing station.

In some embodiments, transferring the new replaceable part to the processing station includes utilizing the robotic arm motion pattern to place the replaceable part in the processing station.

In some embodiments, transferring the replaceable part to a storage chamber includes utilizing a first workpiece handling robot to transfer the used replaceable part to a stacked arrangement in a transfer position in the transfer chamber and utilizing a second workpiece handling robot to transfer the used replaceable part from the stacked arrangement in the transfer position to the storage chamber.

In some embodiments, removing a new replaceable part from the storage chamber with the workpiece handling robot includes utilizing the second workpiece handling robot to transfer the new replaceable part from the storage chamber to the stacked arrangement in the transfer chamber and utilizing the first workpiece handling robot to transfer the replaceable part from the stacked arrangement in the transfer position to the processing station.

In some embodiments, the stacked arrangement includes a plurality of shelves configured to support one or more replaceable parts having a larger diameter than the workpieces.

Another example embodiment is directed to an end effector for moving workpieces and replaceable parts within a system for processing workpieces, where the end effector extends between a proximal end and a distal end along an axial direction. The end effector has an arm portion extending between a first arm end and a second arm end along the axial direction, with the first arm end being at the proximal end of the end effector. The end effector further has a spatula portion extending between a first spatula end and a second spatula end along the axial direction, with the first spatula end being adjacent the second arm end and the second spatula end being at the distal end of the end effector. Additionally, the end effector has a first support member extending outwardly from an upper surface of the spatula portion, a second support member extending outwardly from the upper surface of the spatula portion, and a shared support member extending outwardly from an upper surface of the arm portion. The shared support member and the first support member together are configured to support workpieces of a first diameter, and the shared support member and the second support member together are configured to support replaceable parts of a second diameter.

In some embodiments, the first diameter can be smaller than the second diameter. Further, in one or more embodiments, the second support member can be closer to the proximal end than the first support member.

Moreover, in some embodiments, the first and second support members are spaced apart along the longitudinal direction such that a first contact area on the shared support member for workpieces supported on the first support member can he separate from a second contact area on the shared support member for replaceable parts supported on the second support member. In some embodiments, the second contact area can he closer to the proximal end than the first contact area.

In some embodiments, the first and second support members can be spaced apart along the longitudinal direction such that a first contact area on the shared support member for workpieces supported on the first support member and a second contact area on the shared support member for replaceable parts supported on the second support member at least partially overlap.

Another example embodiment of the present disclosure is directed to an end effector for moving workpieces and replaceable parts within a system for processing workpieces, where the end effector extends between a proximal end and a distal end along an axial direction. The end effector includes an arm portion extending between a first arm end and a second arm end along the axial direction, with the first arm end being at the proximal end of the end effector. The end effector further includes a spatula portion extending between a first spatula end and a second spatula end along the axial direction, with the first spatula end being adjacent the second arm end and the second spatula end being at the distal end of the end effector. Moreover, the end effector includes a first support member extending outwardly from an upper surface of the spatula portion, where the first support member is positioned at a first distance from a longitudinal axis of the end effector along a first direction. Additionally, the end effector includes a second support member extending outwardly from the upper surface of the spatula portion, where the second support member is positioned at a second distance from the longitudinal axis of the end effector along the first direction. The first distance is greater than the second distance. In some embodiments, the second support member can be closer to the proximal end than the first support member.

Some embodiments can include a further first support member and a further second support member extending outwardly from the upper surface of the arm portion, where the first support member and the further first support member are configured to support workpieces of a first diameter, and the second support member and the further second support member are configured support replaceable parts of a second diameter.

In some embodiments, the further second support member can be closer to the distal end than the first support member.

In some embodiments, a shared support member extends outwardly from an upper surface of the arm portion, where the shared support member and the first support member can be together configured to support workpieces of a first diameter, and the shared support member and the second support member can be together configured to support replaceable parts of a second diameter.

Further, in some embodiments, the first and second support members can be spaced apart along the longitudinal direction such that a first contact area on the shared support member for workpieces supported on the first support member is separate from a second contact area on the shared support member for replaceable parts supported on the second support member.

Moreover, in some embodiments, the second contact area can be closer to the proximal end than the first contact area.

Additionally, in some embodiments, the first and second support members can be spaced apart along the longitudinal direction such that a first contact area on the shared support member for workpieces supported on the first support member and a second contact area on the shared support member for replaceable parts supported on the second support member at least partially overlap.

Another example embodiment of the present disclosure is directed to a focus ring adjustment assembly of a system for processing workpieces under vacuum, where the focus ring extends along a vertical direction between an upper side and a lower side, the lower side having a first surface portion and a second surface portion and the first surface portion being vertically above the second surface portion. The focus ring adjustment assembly includes a pin extending between a proximal end and a distal end, with the distal end being configured to selectively contact the first surface portion of the focus ring. The focus ring adjustment assembly further includes an actuator operable to move the pin along the vertical direction between an extended position and a retracted position. The extended position of the pin is associated with the distal end of the pin contacting the first surface of the focus ring, and the focus ring being accessible for removal by a workpiece handling robot from the vacuum process chamber.

In some embodiments, the focus ring can be positioned vertically higher along the vertical direction when the pin is in the extended position relative to when the pin is in a retracted position.

Some embodiments can include a rotary actuator configured to selectively rotate the pin, wherein rotation of the pin through a. predefined locking angle secures the focus ring to the pin.

In some embodiments, the pin has a main body portion and a flange portion, where the main body portion extends between the proximal end and the distal end, and the flange portion is spaced apart from the distal end of the pin and extends outwardly from the main body portion. The flange portion can be configured to contact a transition surface portion positioned vertically between the first surface portion and the second surface portion of the focus ring when the distal end of the pin is contacts the first surface portion of the focus ring.

Some embodiments further include a support plate positioned within the vacuum process chamber and a floating coupling fixed to the proximal end of the pin. The floating coupling can be slidably supported by the support plate such that the floating coupling is movable relative the support plate in a horizontal direction. The actuator can be configured to move the support plate along the vertical direction between a raised position and a lowered position to move the pin between the extended position and the retracted position, Where the raised position of the support plate can be associated with the extended position of the pin and the lowered position of the support plate can be associated with the retracted position of the pin.

In some embodiments, the actuator can be vacuum sealed, with the actuator being positioned exterior to the vacuum process chamber, and the actuator being coupled to the support plate via a connection shaft extending through an exterior wall of the vacuum process chamber.

Another example embodiment of the present disclosure is directed to a focus ring adjustment assembly of a system for processing workpieces under vacuum, with a focus ring extending between an upper side and a lower side along a vertical direction, and the focus ring having a groove recessed inwardly from the lower side towards the upper side. The focus ring adjustment assembly can include a pin extending between a proximal end and a distal end, where the distal end can be configured to selectively contact the groove. Additionally, the focus ring adjustment assembly can include an actuator operable to move the pin along the vertical direction between an extended position and a retracted position. The extended position of the pin can be associated with the distal end of the pin contacting the groove, and the focus ring being accessible for removal from the vacuum process chamber by a workpiece handling robot.

In some embodiments, the focus ring can extend between an inner surface and an outer surface along a radial direction, with the groove being annular about the focus ring and spaced apart from the inner and outer surfaces.

In at least one embodiment, the groove has a first groove portion and a second groove portion, with the first groove portion extending from the lower side of the focus ring to a first distance from the lower side, and the second groove portion extending from the first distance to a second distance from the lower side, where the second distance can be less than a thickness of the focus ring between the upper and lower sides along the vertical direction.

In embodiments, the pin can have a main body portion and a flange portion, where the main body portion extends between the proximal and distal ends, and the flange portion is spaced apart from the distal end of the pin and extending outwardly from the main body portion. The flange portion can be configured to be at least partially received within the first groove portion, and the portion of the pin extending between the flange portion and the distal end can be at least partially received within the second groove portion.

In some embodiments, the focus ring can be positioned vertically higher along the vertical direction when the pin is in the extended position relative to when the pin is in the retracted position.

Further, some embodiments can include a support plate positioned within the vacuum process chamber and adjacent to an exterior wall of the vacuum process chamber, and a floating coupling fixed to the proximal end of the pin. The floating coupling can be slidably supported by the support plate such that the floating coupling is movable relative the support plate in a horizontal direction. The actuator can be configured to move the support plate along the vertical direction between a raised position and a lowered position to move the pin between the extended position and the retracted position, with the raised position of the support plate being associated with the extended position of the pin and the lowered position of the support plate being associated with the retracted position of the pin.

Additionally, in some embodiments, the actuator can be vacuum sealed, with the actuator being positioned exterior to the vacuum process chamber, and the actuator being coupled to the support plate via a connection shaft extending through the exterior wall of the vacuum process chamber.

Another example embodiment of the present disclosure is directed to a plasma processing apparatus. The apparatus can include a processing chamber defining a vertical direction and a lateral direction. The plasma processing apparatus can include a pedestal disposed within the processing chamber. The pedestal can be configured to support the substrate. The plasma processing apparatus can include a radio frequency (RF) bias electrode disposed within the pedestal. The RF bias electrode can extend between a first end of the RF bias electrode and a second end of the RF bias electrode along the lateral direction. The RF bias electrode can define a RF zone extending between the first end of the RF bias electrode and the second end of the RF bias electrode along the lateral direction. In some implementations, the RF zone can extend from the first end of the RF bias electrode to the second end of the RF bias electrode along the lateral direction. Alternatively or additionally, the RF zone can extend between the RF bias electrode and a dielectric window of the plasma processing apparatus along the vertical direction.

The plasma processing apparatus can include a focus ring disposed within the processing chamber. The plasma processing apparatus can include a focus ring adjustment assembly that includes a lift pin positioned outside of the RF zone. The lift pin can be movable along the vertical direction to move the focus ring between at least a first position and a second position to adjust a distance between the pedestal and the focus ring along the vertical direction. In some implementations, the focus ring is located on the pedestal when the focus ring is in the first position. Furthermore, the focus ring is spaced apart from the pedestal by a distance that is when the focus ring is in the second position.

In some implementations, the plasma processing apparatus can include a ground plane spaced apart from the RF bias electrode along the vertical direction. The ground plane can extend between a first end of the ground plane and a second end of the ground plane along the lateral direction. In some implementation, a length of the ground plane along the lateral direction can be greater than a length of the RF bias electrode along the lateral direction. In some implementations, the lift pin penetrates the ground plane. In some implementations, the RF bias electrode and the ground plane are disposed within the pedestal.

In some implementations, the focus ring adjustment assembly can include an actuator configured to move the lift pin along the vertical direction to move the focus ring between at least the first position and the second position. In some implementations, the actuator is positioned outside of the processing chamber. In some implementations, the focus ring adjustment assembly can include a second actuator configured to rotate the lift pin about the vertical direction. In some implementations, the second actuator is positioned outside of the processing chamber.

Another example embodiment of the present disclosure is directed to a plasma processing apparatus. The apparatus can include a processing chamber defining a vertical direction and a lateral direction. The plasma processing apparatus can include a pedestal disposed within the processing chamber. The pedestal can be configured to support the substrate. The plasma processing apparatus can include a radio frequency (RF) bias electrode disposed within the pedestal. The RF bias electrode can extend between a first end of the RF bias electrode and a second end of the RF bias electrode along the lateral direction. The RF bias electrode can define a RF zone extending between the first end of the RF bias electrode and the second end of the RF bias electrode along the lateral direction. The plasma processing apparatus can include a ground plane spaced apart from the RF bias electrode along the vertical direction. The plasma processing apparatus can include a focus ring disposed within the processing chamber. The plasma processing apparatus can include a focus ring adjustment assembly that includes a lift pin that penetrates the ground plane. The lift pin can be movable along the vertical direction to move the focus ring between at least a first position and a second position to adjust a distance between the pedestal and the focus ring along the vertical direction. In some implementations, the lift pin can be positioned outside of the RF zone.

Referring now to the FIGS., example embodiments of the present disclosure will now be described.

FIG. 1 depicts an example workpiece processing system 100 according to example embodiments of the present disclosure. The processing system 100 can include a front end portion 112, one or more loadlock chambers 114, a transfer chamber 115 and a plurality of process chambers, including a first process chamber 120 and a second process chamber 130. The system can include a first workpiece handling robot 150 for transferring workpieces to and from the workpiece column 110 in the loadlock chamber 114 and the first process chamber 120 and second process chamber 130 and/or between the first process chamber 120 and the second process chamber 130.

The front end portion 112 can be configured to be maintained at atmospheric pressure and can he configured to engage workpiece input devices 118. The workpiece input devices 118 can include, for instance, cassettes, front opening unified pods, or other devices for supporting a plurality of workpieces. Workpiece input devices 118 can be used to provide preprocess workpieces to the processing system 100 or to receive post-process workpieces from the processing system 100.

The front end portion 112 can include one or more robots (not illustrated) for transferring workpieces from workpiece input devices 118 to, for instance, the loadlock chamber 114, such as to and from a workpiece column 110 located in the loadlock chamber 114. In one example, the robot in the front end portion 112 can transfer preprocess workpieces to the loadlock chamber 114 and can transfer post-process workpieces from the loadlock chamber 114 to one or more of the workpiece input devices 118. Any suitable robot for transferring workpieces can be used in the front end portion 112 without deviating from the scope of the present disclosure. Workpieces can be transferred to and or from the loadlock chamber 114 through a suitable slit, opening, or aperture.

The loadlock chamber 114 can include a workpiece column 110 configured to support a plurality of workpieces in a stacked arrangement. The workpiece column 110 can include, for instance, a plurality of shelves. Each shelf can be configured to support one or more workpieces. In one example implementation, the workpiece column 110 can include one or more shelves for supporting preprocess workpieces and one or more shelves for supporting post-process workpieces.

In some embodiments, appropriate valves can be provided in conjunction with the loadlock chamber 114 and other chambers to appropriately adjust the process pressure for processing the workpieces. In some embodiments, the loadlock chamber 114 and the transfer chamber 115 can be maintained at the same pressure. In this embodiment, there is no need to seal the loadlock chamber 114 from the transfer chamber 115. Indeed, in some embodiments, the loadlock chamber 114 and the transfer chamber 115 can be a part of the same chamber.

A single loadlock chamber 114 is illustrated in FIG. 1. Those of ordinary skill in the art, using the disclosures provided herein, will understand that multiple loadlock chambers 114 can be used in any of the processing systems described herein without deviating from the scope of the present disclosure. For instance, the system 100 can include a first loadlock chamber to transfer workpieces into a vacuum portion of the system 100 and a second loadlock chamber to transfer workpieces out of a vacuum portion of the system 100.

The first process chamber 120 and the second process chamber 130 can be used to perform any of a variety of workpiece processing on the workpieces, such as vacuum anneal processes, surface treatment processes, dry strip processes, dry etch processes, deposition processes, and other processes. In sonic embodiments, one or more of the first process chamber 120 and the second process chamber 130 can include plasma based process sources such as, for example, inductively coupled plasma (ICP) sources, microwave sources, surface wave plasma sources, ECR plasma sources, and capacitively coupled (parallel plate) plasma sources.

As illustrated, each of the first process chamber 120 and second process chamber 130 includes a pair of processing stations in side-by-side arrangement so that a pair of workpieces can be simultaneously exposed to the same process. More particularly, the first process chamber 120 can include a first processing station 122. and a second processing station 124 in side-by-side arrangement. The second process chamber 130 can include a first processing station 132 and a second processing station 134 in side-by-side arrangement. Each processing station can include a workpiece support (e.g., a pedestal) for supporting a workpiece during processing. In some embodiments, each processing station can share a common pedestal with two portions for supporting a workpiece. In some embodiments, the workpiece support can include a pedestal assembly including a baseplate, an electrostatic chuck configured to support the workpiece and a replaceable part. The replaceable part can include a focus ring arranged relative to the electrostatic chuck such that at least a portion of the focus ring at least partially surrounds a periphery of the workpiece when the workpiece is positioned on the electrostatic chuck. The first process chamber 120 and/or the second process chamber 130 can be selectively sealed off from the transfer chamber 115 for processing.

The transfer chamber 115 can include a workpiece handling robot 150. The workpiece handling robot 150 can be configured to transfer workpieces from the workpiece column 110 in the loadlock chamber 114 to the processing stations in the first process chamber 120 and/or the second process chamber 130. The workpiece handling robot 150 can also transfer workpieces between the first process chamber 120 and the second process chamber 130.

As shown in FIG. 1, the workpiece processing system 100 can include a storage chamber 250 for storing new and/or used replaceable parts (e,g., focus rings) coupled to the transfer chamber 115. In some embodiments, the storage chamber is mounted to a rear side of a transfer chamber 115. The storage chamber 250 can include a plurality of shelves configured to support replaceable parts. The shelves can be configured such that a plurality of replaceable parts can be supported in a vertical/stacked arrangement. In certain embodiments, the shelves can be coupled to an elevator such that the elevator is configured to move replaceable parts up and down within the storage chamber 250. In some embodiments, the storage chamber 250 can include one or more test workpieces. For instance, one or more of the shelves can be configured to support a test workpiece.

In some embodiments, the storage chamber 250 is a vacuum capable storage chamber capable of being maintained at the same vacuum as the transfer chamber 115. In certain other embodiments, the storage chamber 250 is configured such that it can be sealed off from the transfer chamber 115. The vacuum capable storage chamber can include one or more access doors configured to allow the workpiece handling robots to access replaceable parts in the storage chamber. For example, the access doors are large enough such that the workpiece handling robots can place a used replaceable part on a shelf within the storage chamber 250 and can remove a new replaceable part from one of the shelves. Accordingly, replaceable parts can be placed in or removed from the storage chamber 250 without breaking the vacuum of the overall system.

In some embodiments, the storage chamber 250 can include one or more access doors configured to allow for replacement of new or used replaceable parts from the atmospheric surrounding environment. For example, in certain embodiments the storage chamber 250 in communication with the transfer chamber 115 can be sealed off such that the transfer chamber 115 remains at a desired process pressure. The storage chamber 250 can then be accessed and serviced from the atmospheric environment such that used replaceable parts can be removed from the storage chamber 250 and new replaceable parts can be placed within the storage chamber 250. After service of the storage chamber 250 is complete, the storage chamber 250 can be brought back to the desired process pressure utilizing any known system for establishing a process pressure within the storage chamber 250. Once at the desired process pressure is achieved, such as the same process pressure or vacuum as the transfer chamber 115, the storage chamber 250 can be unsealed from the transfer chamber 115 such that one or more of the workpiece handling robots can again access the storage chamber 250.

The workpiece handling robot 150 can be configured to transfer replaceable parts among the storage chamber 250 and the various processing stations for automated replacement of replaceable parts without breaking vacuum. For example, the workpiece handling robot 150 can be used to transfer replaceable parts from the first process chamber 120 or the second process chamber 130 to the storage chamber 250. The workpiece handling robot 150 can also be used to transfer replaceable parts from the storage chamber 250 to the first process chamber 120 or the second process chamber 130. In certain embodiments the workpiece handling robot 150 can retrieve a used replaceable part from one of the processing stations in the first process chamber 120 and/or second process chamber and transfer the used part to the storage chamber 250. The workpiece handling robot 150 can also retrieve a new replaceable part from the storage chamber 250 and transfer the new replaceable part to one of the processing stations of either the first process chamber 120 or the second process chamber 130.

The workpiece handling robot can be coupled a controller, such that the controller can be used to control the workpiece handling robot for transferring new or used replaceable parts to and from the storage chamber and process chambers 120 and 130. The controller can be configured to control motion of the workpiece handling robot 150 according to a robotic arm motion pattern 280 (shown in FIG. 6) for accessing the one or more processing stations of the first process chamber 120 or the second process chamber 130.

Figure 2:
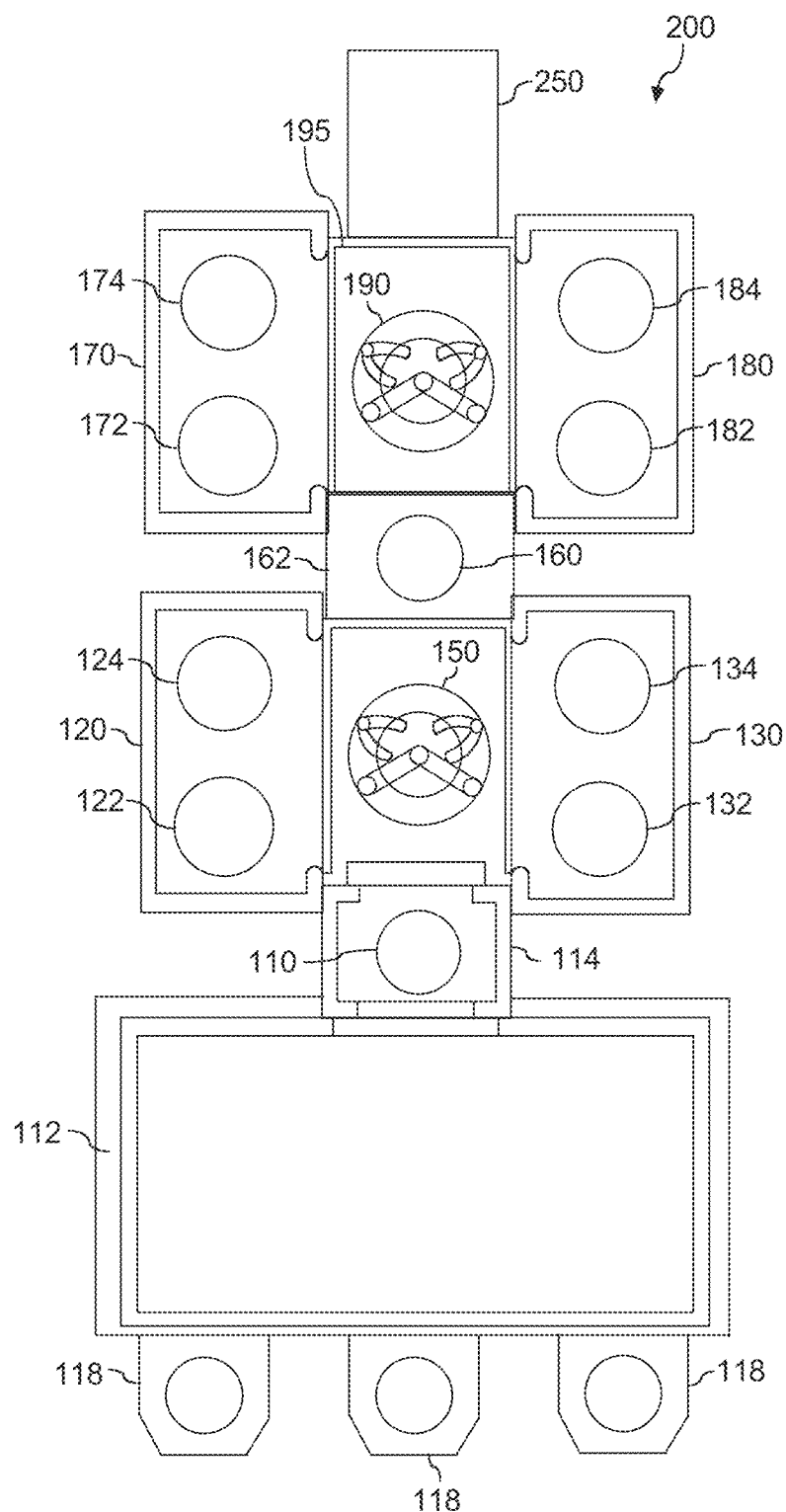
FIG. 2 depicts a plan view of an example processing system according to example embodiments of the present disclosure.

Referring now to FIG. 2, the processing system 200 can include additional process chambers, including a third process chamber 170 and fourth process chamber 180. The third process chamber 170 is disposed in linear arrangement with the first process chamber 120 and the fourth process chamber 180 is disposed in linear arrangement with the second process chamber 130 such that the third process chamber 170 and the fourth process chamber 180 are disposed on opposing sides of the transfer chamber 195.

The third process chamber 170 and the fourth process chamber 180 can be used to perform any of a variety of workpiece processing on the workpieces, such as vacuum anneal processes, thermal treatment process, surface treatment processes, dry strip processes, dry etch processes, deposition processes, and other processes. In some embodiments, one or more of the third process chamber 170 and the fourth process chamber 180 can include plasma based process sources such as, for example, inductively coupled plasma (ICP) sources, microwave sources, surface wave plasma sources, ECR plasma sources, and capacitively coupled (parallel plate) plasma sources. In particular embodiments, the focus rings can be used in plasma processing sources used to provide a direct ion plasma etch process.

As illustrated, each of the third process chamber 170 and fourth process chamber 180 includes a pair of processing stations in side-by-side arrangement so that a pair of workpieces can be simultaneously exposed to the same process. More particularly, the third process chamber 170 can include a first processing station 172 and a second processing station 174 in side-by-side arrangement. The fourth process chamber 180 can include a first processing station 182 and a second processing station 184 in side-by-side arrangement. Each processing station can include a workpiece support (e.g., a pedestal) for supporting a workpiece during processing. In some embodiments, each processing station can share a common pedestal with two portions for supporting a workpiece. In some embodiments, the workpiece support can include a pedestal assembly including a baseplate, an electrostatic chuck configured to support the workpiece and a replaceable part. The replaceable part can include a focus ring arranged relative to the electrostatic chuck such that at least a portion of the focus ring at least partially surrounds a periphery of the workpiece when the workpiece is positioned on the electrostatic chuck. In some embodiments, the third process chamber 170 and/or the fourth process chamber 180 can be selectively sealed off from the transfer chamber 115 for processing.

To transfer workpieces to the third process chamber 170 and second process chamber 180, the system 200 can further include a transfer position 162 and a second workpiece handling robot 190. The transfer position 162 can be a part of the transfer chamber 162 or can be a separate chamber. The transfer position 162 can include a support column 160 for supporting a plurality of workpieces in a stacked arrangement and/or side-by-side arrangement. For instance, the support column 160 can include a plurality of shelves configured to support workpieces in a stacked vertical arrangement. The first workpiece handling robot 150 can be configured to transfer workpieces from the workpiece column 110, the first process chamber 120, or the second process chamber 130 to the workpiece column 160 in the transfer position 162. A second workpiece handling robot 190 can be configured to transfer workpieces from the support column 160 in the transfer position 162 to the processing stations in the third process chamber 170 and/or the fourth process chamber 180. The workpiece handling robot 190 can also transfer workpieces from the third process chamber 170 to the fourth process chamber 180.

As shown in FIG. 2, the workpiece processing system 200 can include a storage chamber 250 for storing new and/or used replaceable parts (e.g., focus rings) coupled to the transfer chamber. The storage chamber is mounted to a rear side of a transfer chamber. The workpiece handling robots 150 and 190 can be configured to transfer replaceable parts among the various transfer positions and processing stations for automated replacement of replaceable parts without breaking vacuum. In some embodiments, the storage chamber 250 can store test workpieces.

To transfer replaceable parts between the first process chamber 120, second process chamber 130 and the storage chamber 250, the system 200 can utilize the second workpiece handling robot 190 to transfer new or used replaceable parts from the storage chamber 250 to the support column 160 in the transfer position 162. The transfer position 162 can be a part of the transfer chamber 162 or can be a separate chamber. The transfer position 162 can include a support column 160 for supporting a plurality of replaceable parts in a stacked arrangement. For instance, the support column 160 can include a plurality of shelves configured to support replaceable parts in a stacked vertical arrangement. Accordingly, in some embodiments, the support column 160 is configured such that it can support both workpieces and replaceable parts in a stacked arrangement. The first workpiece handling robot 150 can be configured to transfer replaceable parts from the support column 160 to the side-by-side processing stations 122 and 124 of the first process chamber 120 or the side-by-side processing stations 132 and 134 of the second process chamber 130. The second workpiece handling robot 190 can be configured to transfer replaceable parts from the support column 160 in the transfer position 162 to the side-by-side processing stations 172 and 174 in the third process chamber, the side-by-side processing stations 182 and 184 in the fourth process chamber 180, and/or the storage chamber 250.

For removing used replaceable parts or providing new replaceable parts to one or more processing stations, the workpiece handling robots 150 and 190 can utilize a robotic arm motion pattern. For example, a controller can be utilized to control the motions of end effector on the arm of the workpiece handling robots 150 and 190 to control the motion of the end effector when accessing a processing station to transfer a replaceable part. The workpiece handling robot 150 can utilize the robotic arm motion pattern to access the processing stations 122, 124, 132, and 134. The workpiece handling robot 190 can utilize the robotic arm motion pattern to access the processing stations 172, 174, 182, and 184.

The processing system 200 includes four process chambers 120, 130, 170, and 180 and can be configured to simultaneously process up to eight workpieces at a time. Additional process stations can be added in linear fashion to provide additional processing capability. For instance, a fifth process chamber can be added in linear arrangement with the third process chamber 170. A sixth process chamber can be added in linear arrangement with the fourth process chamber 180. An additional transfer position and workpiece handling robot can be used to transfer workpieces to and from the fifth and sixth process chambers. Additional processing chambers can be included by extending the processing system in linear fashion in this manner.

In certain embodiments, the workpiece storage chamber can be located at other locations within the processing system without deviating from the scope of the present disclosure. For instance, in some embodiments, the workpiece storage chamber could be located above or below a transfer position (e.g., transfer position 162 of processing system 200). In addition, one or more of the processing chambers of a workpiece processing system (e.g., processing stations 120, 130, 170 or 180 of processing system 200)

can be replaced with a storage chamber for new and/or used replaceable parts according to example embodiments of the present disclosure.

In other embodiments, the storage chamber 250 can be located at other locations within the processing system without deviating from the scope of the present disclosure. For example, the storage chamber could be disposed on one or more of the process chambers 120, 130, 170, and/or 180. The storage chamber could also be located above or below a transfer position (e.g., transfer position 162 of processing system 200). In addition, one or more of the processing chambers of a workpiece processing system (e.g., processing stations 120, 130, 170 or 180 of processing system 200) can be replaced with a storage chamber for new and/or used replaceable parts according to example embodiments of the present disclosure.

Figure 3:
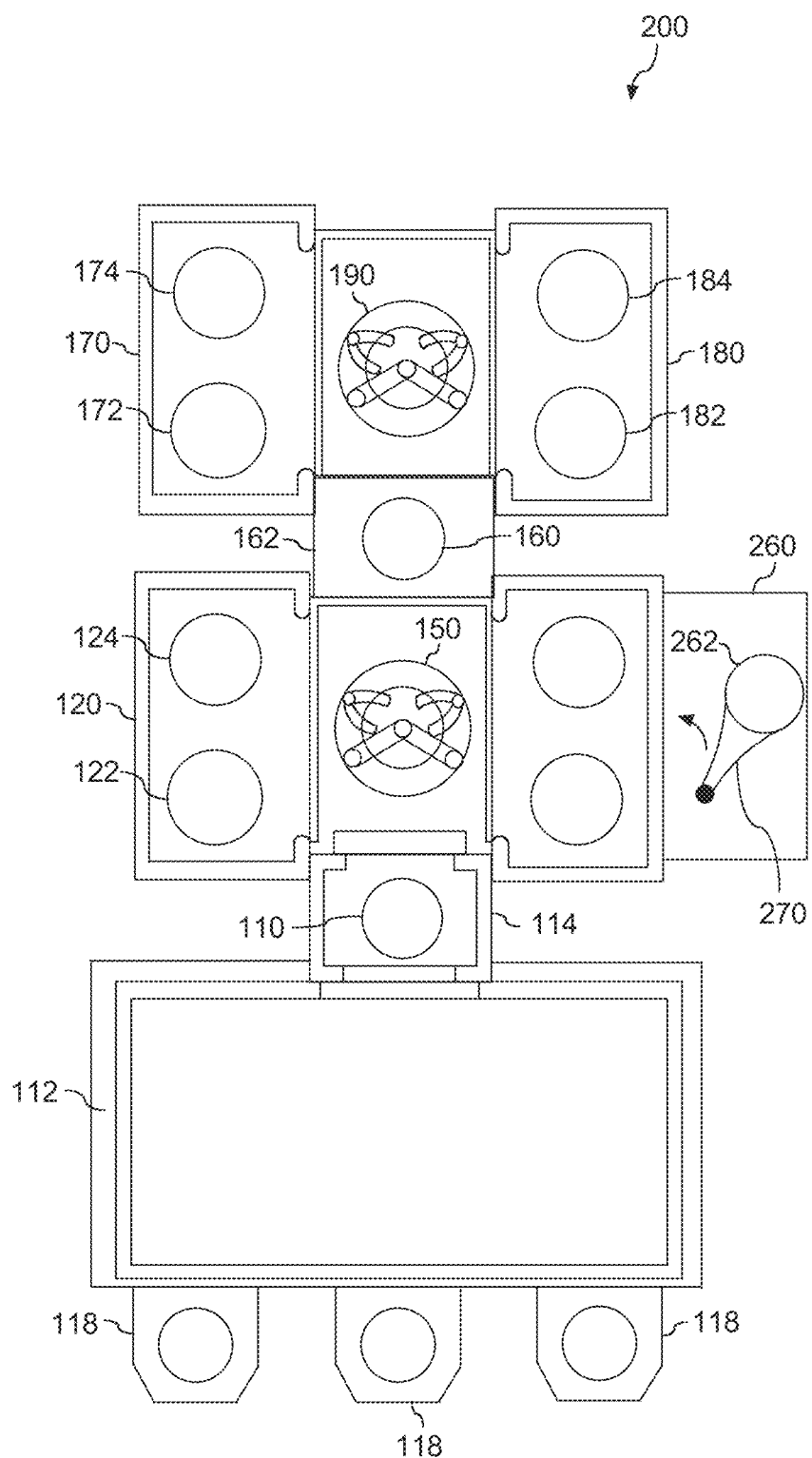
FIG. 3 depicts a plan view of an example processing system according to example embodiments of the present disclosure.

FIG. 3 depicts an example transfer mechanism 260 mounted to a processing chamber of a workpiece processing system 200 according to example embodiments of the present disclosure. The transfer mechanism 260 can be coupled directly to the processing chamber 130. In other embodiments, the transfer mechanism 260 can be coupled to any of the processing chambers including 120, 130, 170, and/or 180. As shown, the transfer mechanism 260 can include a replaceable part storage location 262 (e.g., shelves) that can be used to store used and new replaceable parts (e.g., focus rings). The transfer mechanism 260 can include robotics 270 configured to transfer replaceable parts to its proper position in the processing station.

Figure 4:
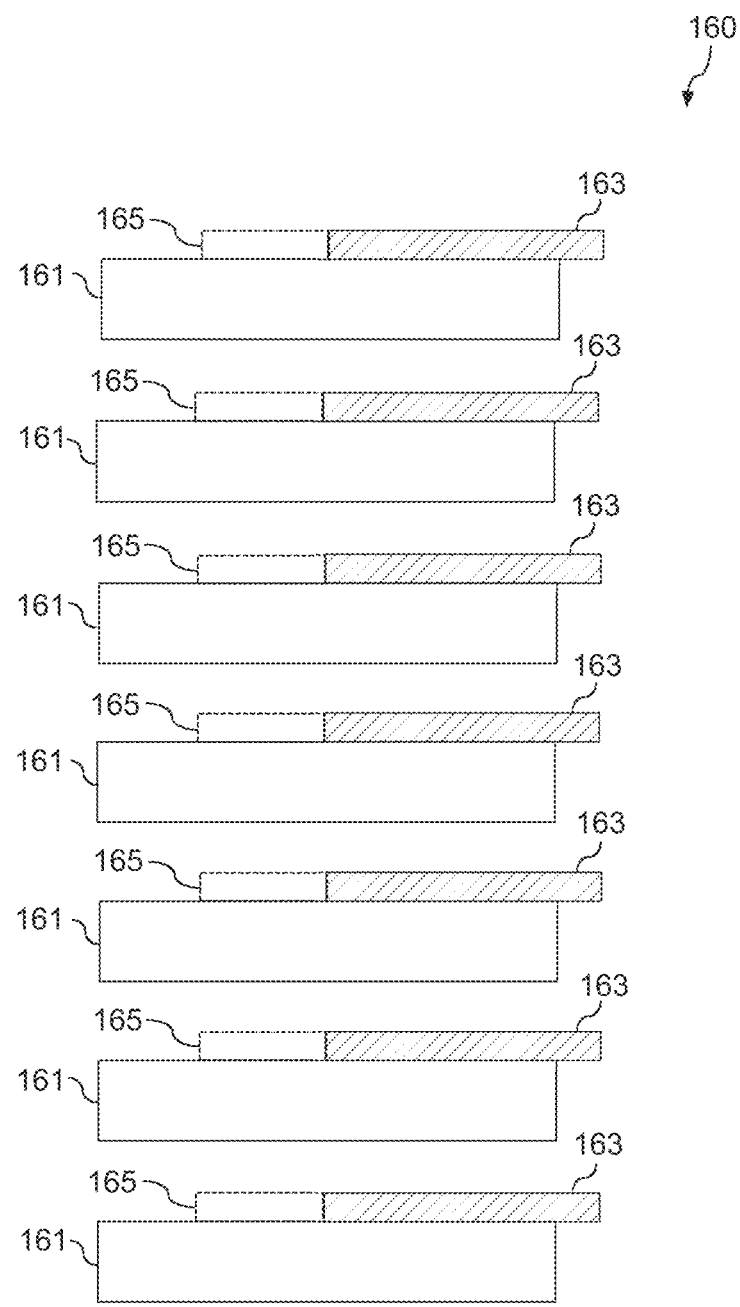
FIG. 4 depicts an example transfer position according to example embodiments of the present disclosure.

FIG. 4 depicts a side view of an example support column 160 in a transfer position 162 according to example embodiments of the present disclosure. As shown, the support column 160 can include a plurality of shelves 161. Each shelf 161 can be configured to support a workpiece 163 so that a plurality of workpieces 163 can be arranged on the support column in a vertical/stacked arrangement. Each shelf 161 can also be configured to support a replaceable part 165 so that a plurality of replaceable parts 165 can be arranged on the support column 160 in a vertical/stacked arrangement. Accordingly, the shelves 161 of the support column 160 are configured such that they can support both workpieces 163 and replaceable parts 165. In certain embodiments, the replaceable part 165 can have a larger diameter as compared to the workpiece 163. Accordingly, the shelves 161 are configured such that they can support a replaceable part 165 having a larger diameter than a workpiece 163. In certain embodiments, the replaceable part can include a focus ring. Focus rings utilized in the systems provided herein can have a larger diameter as compared to workpieces. Accordingly, the support column 160 is configured such that it can support both workpieces and focus rings having larger diameters.

In some embodiments, the transfer position can have an opening or aperture that passes all the way through the transfer position so that workpiece handling robots can transfer workpieces and or replaceable parts using a direct transfer between robots.

Figure 5:
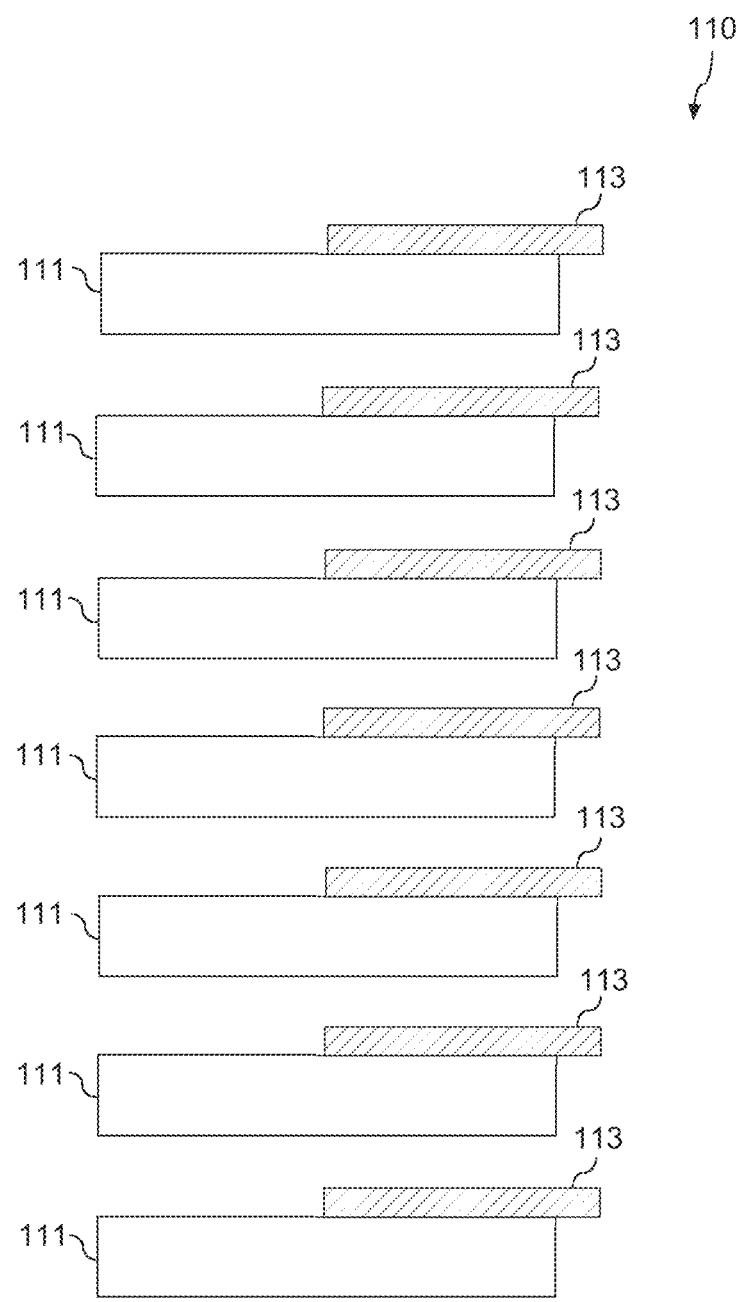
FIG. 5 depicts an example workpiece column according to example embodiments of the present disclosure.

FIG. 5 depicts a side view of an example workpiece column 110 according to example embodiments of the present disclosure. As shown, the workpiece column 110 can include a plurality of shelves 111. Each shelf 111 can be configured to support a workpiece 113 so that a plurality of workpieces 113 can be arranged on the workpiece column 110 in a vertical stacked arrangement.

In some embodiments, alternative approaches to the delivery of replaceable parts in a workpiece processing system can be used without deviating from the scope of the present disclosure. For example, additional transfer mechanism (e.g., robots, shuttle mechanisms, multi-axis robotics) can be mounted to a process chamber to transfer replaceable parts into and out of the process chamber.

Figure 6:
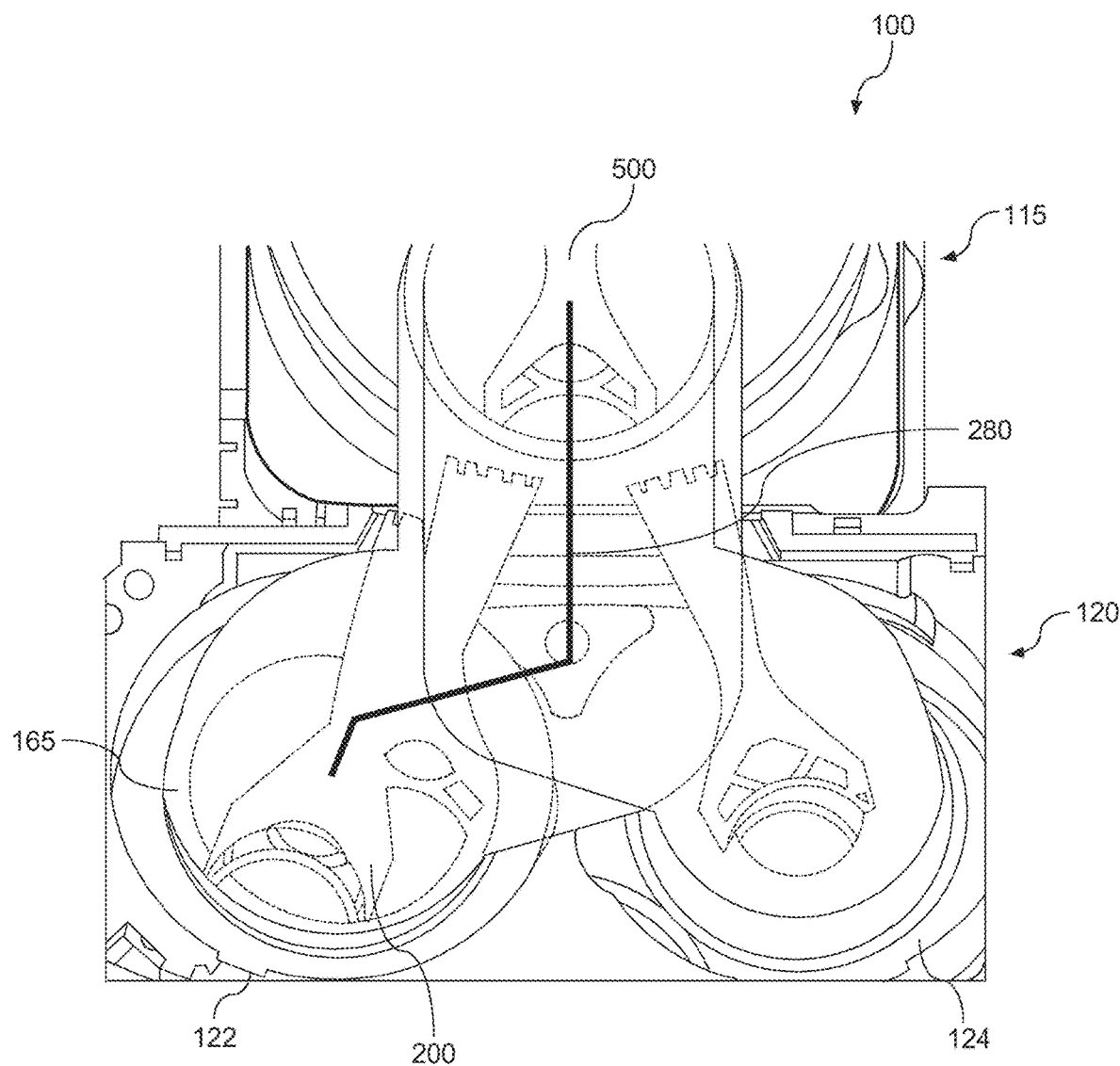
FIG. 6 depicts an example robotic arm motion pattern according to example embodiments of the present disclosure.

FIG. 6 depicts an example robotic arm motion pattern according to example embodiments of the present disclosure. As shown, the system 100 includes a workpiece handling robot 150 having an arm with an end effector 500. As shown in FIG. 6, the end effector 500 can be moved within the system 100 according to multiple directional movements. For example, the end effector 500 can be located inside the transfer chamber 115. When it is time to retrieve a used replaceable part 165 from one of the side-by-side processing stations (122 or 124, as shown), the end effector 500 can move into one of the processing stations according to a robotic arm motion pattern 280.

The robotic arm motion pattern 280 can include extending in a first direction for a first period of time, extending in a second direction generally lateral to the first direction for a second period of time, and extending in a third direction that is different from the first direction and second direction for a third period of time. As shown, the robotic arm motion pattern 280 can be utilized to place the end effector 500 into one of the processing stations 122 or 124.

In some embodiments the robotic arm motion pattern can include extending the end effector 500 in a first direction for a first period of time such that the end effector enters the processing chamber 120. Accordingly, in some embodiments, extending the end effector 500 in the first direction moves the end effector from the transfer chamber 115 into the process chamber 120, but does not place the end effector 500 within one of the side-by-side processing stations 122, 124. The end effector 500 can then be moved according to a second direction that is generally lateral to the first direction in order to place the end effector 500 within one of the side-by-side processing chambers 122, 124. As used herein, "generally lateral" or "lateral to" refers to within about 45° of perpendicular to the first direction. In some embodiments, the second direction can range from about 10° to about 70°, such as 20° to about 60°, such as 30° to about 50°, of perpendicular to the first direction. The end effector 500 can then be moved in a third direction to ensure proper placement of the end effector 500 in the processing station 122 such that retrieval of a used replaceable part can be accomplished. In some embodiments, the third direction can be within 30° or less of perpendicular to the first direction. In some embodiments, the end effector 500 can also be removed from the processing station 122 according to the same robotic arm motion pattern, For example, the end effector 500 can be retracted back into the transfer chamber 115 according to the same robotic arm motion pattern 280.

In certain embodiments, the end effector 500 can have a new replaceable part 165 thereon. For example, the end effector 500 can retrieve a new replaceable part 165 from either the support column 160 or the storage chamber 250. The end effector 500 having the new replaceable part 165 thereon can then place the new replaceable part 165 within the processing station 122 according to the example robotic arm motion pattern provided herein. For example, the end effector can be moved in a first direction for a first period of time to access the process chamber 120, moved in a second direction lateral to the first direction for a second period of time to access one of the side-by-side processing stations 122, and moved in a third direction different from the first direction and second direction for a third period of time in order to ensure proper placement of the new replaceable part 165 in one of the side-by-side processing stations 122, 124.

The robotic arm motion pattern 280 disclosed herein can be utilized by one or more workpiece handling robots of the system. For example, workpiece handling robots 150 and 190 can both be coupled to a controller capable of executing the robotic arm motion pattern 280 described herein. The robotic arm motion pattern 280 can be utilized by workpiece handling robots 150 and 190 to access any of the side-by-side processing stations 122, 124, 132, 134, 172, 174, 182, and 184 of the respective process chambers 120, 130, 170 and 180, disclosed herein.

In some embodiments, the workpiece handling robots can be configured to transfer workpieces and replaceable parts using a scissor motion. For example, the workpiece handling robot 150 can simultaneously transfer the workpieces from the workpiece column in the loadlock chamber 114 to the two side-by-side processing stations 122 and 124 in the first process chamber 120 using, for instance, a scissor motion. Similarly, the workpiece handling robot 150 can simultaneously transfer workpieces from the workpiece column 110 in the loadlock chamber 114 to the two side-by-side processing stations 132 and 134 in the second process chamber 130 using, for instance, a scissor motion. The workpiece handling robot 190 can simultaneously transfer the workpieces from the support column 160 in the transfer position 162 to the two side-by-side processing stations 172 and 174 in the third process chamber 170 using, for instance, a scissor motion. The workpiece handling robot 190 can simultaneously transfer the workpieces from the support column 160 in the transfer position 162 to the two side-by-side processing stations 182 and 184 in the fourth process chamber 180 using, for instance, a scissor motion.

In some embodiments, a controller can be configured to adjust motion of the end effector to transfer replaceable parts focus rings) based at least in part data received from one or more sensors (e.g., sensors associated with automated wafer centering system). For instance, optical sensor(s) can be used to monitor the motion of a replaceable part during the motion pattern. To ensure the proper placement of the replaceable part, the control can adjust the motion pattern in real time as the workpiece handling robot is transferring the replaceable part to provide for proper placement of the replaceable part with reduced error.

In some embodiments, one or more sensors can be used to determine the position of a replaceable part after being transferred into a process chamber by the workpiece handling robot. The sensors can include, for instance, one or more optical sensors. A controller can be configured to control the workpiece handling robot to adjust the position of the replaceable part when sensor measurements indicate the replaceable part has been positioned incorrectly (e.g., not concentrically with the workpiece support).

Figure 7:
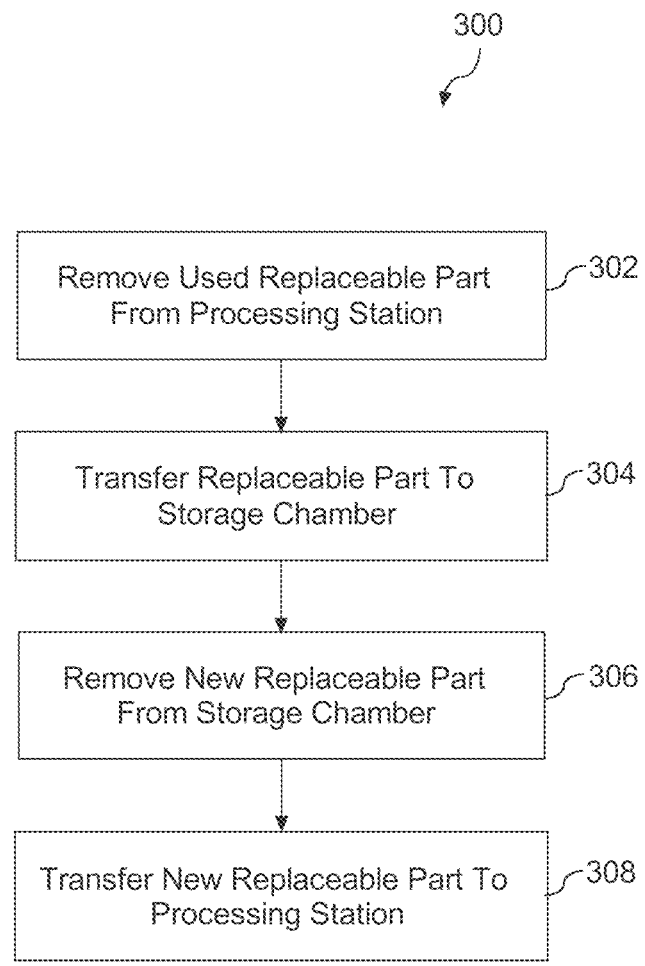
FIG. 7 depicts an example flow diagram of an example method according to example embodiments of the present disclosure.

FIG. 7 depicts a flow diagram of one example method (300) according to example aspects of the present disclosure. The method (300) includes a method for replacing replaceable parts in a system for processing workpieces. The method (300) will be discussed with reference to the system of FIG. 2 by way of example. The method (300) can be implemented in any suitable processing apparatus. FIG. 7 depicts steps performed in a particular order for purposes of illustration and discussion. Those of ordinary skill in the art using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (302) the method can include removing a used replaceable part 165 from a processing station 122, 124, 132, 134, 172, 174, 182, or 184. The workpiece handling robot 150 can move the end effector 500 thereon from the transfer chamber 115 to the process chamber 120 and into the processing station 122 according to a robotic arm motion pattern. The robotic arm motion pattern can include extending the end effector 500 in a first direction for a first period of time, extending the end effector 500 in a second direction lateral to the first direction for a second period of time, and extending the end effector 500 in a third direction different from the first direction and the second direction for a third period of time. Once the end effector 500 is in correct placement within the processing chamber 122, the replaceable part can be placed on the end effector 500. In some embodiments, the end effector 500 can lift the replaceable part 165 from a raised location within the processing station 122. For example, a plurality of pins connected to a lifting mechanism can be used to raise the replaceable part 165 from its processing location to a raised position. Once in a raised position, the end effector 500 can easily be placed under the replaceable part 165 for lifting the replaceable part 165 from the one or more pins.

Once the replaceable part 165 is placed on the end effector 500, the end effector 500 can be retracted back into the transfer chamber 115 via the robotic arm motion pattern. For example, the end effector 500 having the used replaceable part 165 thereon can be retracted according to a third direction different from the first direction and second direction for a third period of time, retracted according to a second direction lateral to the first direction for a second period of time, and retracted according to a first direction for a first period of time until the end effector 500 having the replaceable part 165 thereon is located back within the transfer chamber 115.

At (304) the method includes transferring the replaceable part to the storage chamber. Transferring the replaceable part 165 to the storage chamber 250 can include utilizing the workpiece handling robot 150 to place the used replaceable part 165 on the support column 160 in the transfer position 162. For example, the used replaceable part 165 can be placed on one of the shelves 161 located in the support column 160 in a stacked arrangement. The workpiece handling robot 190 can then remove the used replaceable part 165 from the shelf 161 from the support column 160 and transfer the replaceable part 165 to the storage chamber 250. The workpiece handling robot 190 can place the used replaceable part 165 on one of the shelves located within the storage chamber 250.

At (306) the method includes removing a new replaceable part from the storage chamber. The workpiece handling robot 190 can remove a new replaceable part 165 from one of the shelves in the storage chamber 250 and place the new replaceable part on one of the shelves 161 within the support column 160 in the transfer position 162 in a stacked arrangement.

At (308) the method includes transferring the new replaceable part to a processing station. Once the new replaceable part 165 is placed on one of the shelves 161 in the support column 160, workpiece handling robot 150 can access the support column 160 to remove the new replaceable part 165. Workpiece handling robot 150 can then be utilized to place the new replaceable part inside one of the side-by-side processing stations according to the robotic arm motion pattern. For example, the workpiece handling robot 150 can move the end effector 500 having the new replaceable part 165 thereon from the transfer chamber 115 to the process chamber 120 and into the processing station 122 according to a robotic arm motion pattern. The robotic arm motion pattern can include extending the end effector 500 in a first direction for a first period of time, extending the end effector 500 in a second direction lateral to the first direction for a second period of time, and extending the end effector 500 in a third direction different from the first direction and the second direction for a third period of time. Once the end effector 500 is in correct placement within the processing chamber 122, the new replaceable part 165 can be deposited within the processing station in any suitable manner. For example, in one embodiment, the replaceable part 165 (e.g. focus ring) can be placed on a plurality of pins in a raised position. Once securely placed on the pins, the pins can be lowered to place the replaceable part in a desired location within the processing station 122, such that further workpiece processing can be accomplished.

Once the replaceable part 165 is placed within the processing station 122, the end effector can be retracted back into the transfer chamber 115 via the robotic arm motion pattern 280. For example, the end effector 500 can be retracted according to a third direction different from the first direction and second direction for a third period of time, retracted according to a second direction lateral to the first direction for a second period of time, and retracted according to a first direction for a first period of time until the end effector 500 is located back within the transfer chamber 115.

In some embodiments, the workpiece handling robot can remove a test workpiece from the storage location. The test workpiece can be transferred to the processing station. A test process can be performed with the test workpiece, Data collected during the test process and/or characteristics of the test workpiece can be monitored to determine proper placement of the replaceable part.

Advantageously, the method (300) can be performed to allow for the automated replacement of replaceable parts without having to break vacuum of the processing system, Further, the method (300) allows for replacement of replaceable parts utilizing workpiece handling robots that are capable of transferring both workpieces and replaceable parts that are larger than the workpieces. Also, the robotic arm motion pattern allows for the end effector of the workpiece handling robot to enter one of the side-by-side processing stations, such that a replaceable part can be replaced.

Figure 8:
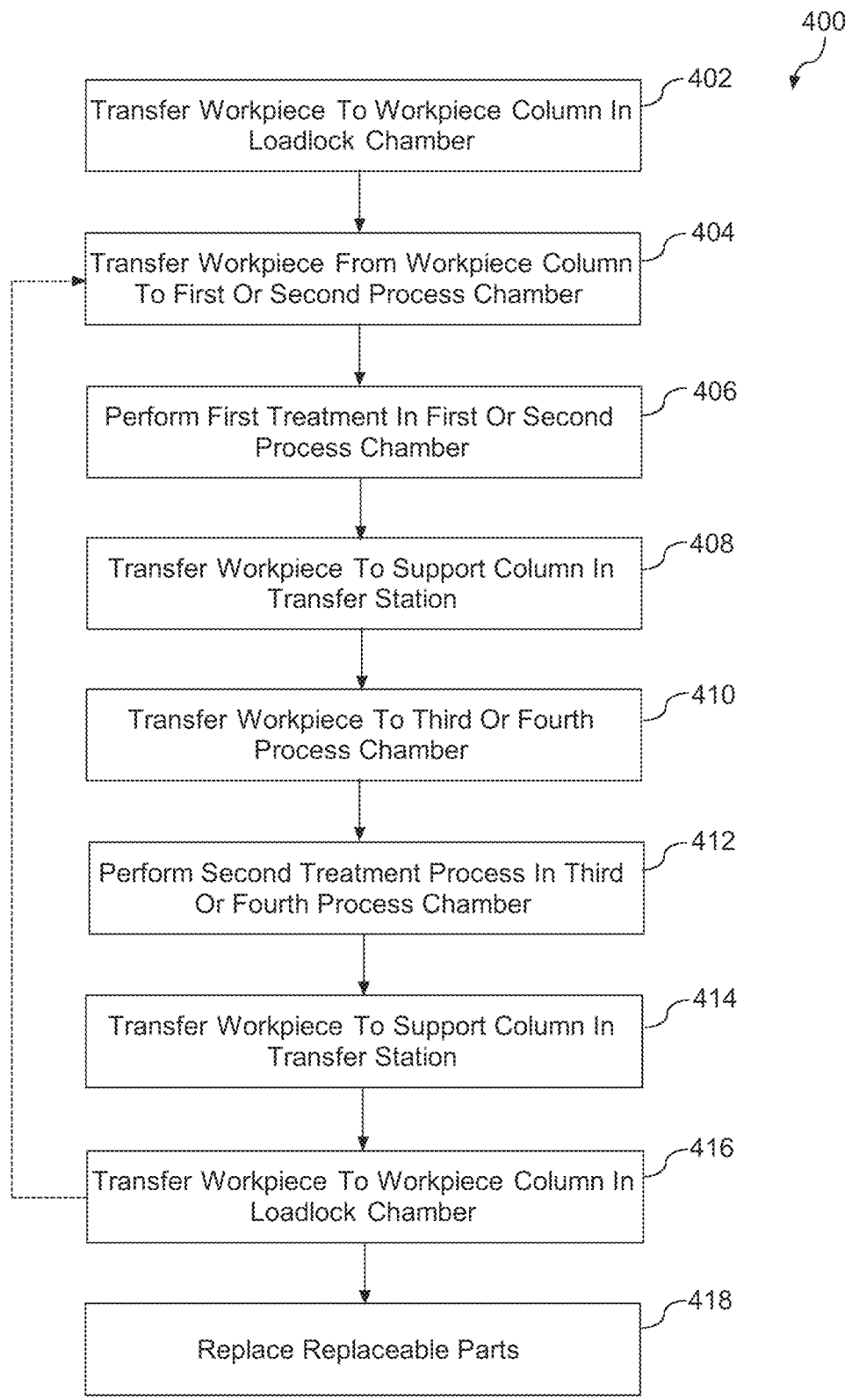
FIG. 8 depicts an example flow diagram of an example method according to example embodiments of the present disclosure.

FIG. 8 depicts a flow diagram of one example method (400) according to example aspects of the present disclosure. The method (400) includes a method for processing workpieces. The method (400) will be discussed with reference to the system of FIG. 2 by way of example. The method (400) can be implemented in any suitable processing apparatus. FIG. 8 depicts steps performed in a particular order for purposes of illustration and discussion. Those of ordinary skill in the art using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the method includes transferring a plurality of workpieces to a workpiece column in a loadlock chamber. For instance, a plurality of workpieces can be transferred from a front end portion of processing system to a workpiece column 110 in a loadlock chamber 114. The workpieces can be transferred to the workpiece column 110, for instance, using one or more robots associated with the front end portion of the processing system.

At (404) the method includes using a workpiece handling robot to transfer workpieces from the workpiece column to the processing stations in the first process chamber and/or second process chamber. For instance, the workpiece handling robot 150 can transfer two workpieces to processing station 122 and processing station 124 respectively in process chamber 120.

At (406) the method includes performing a first treatment process on the plurality of workpieces in the first process chamber and/or second process chamber. The first treatment process can include, for instance, an anneal process, a thermal treatment process, a surface treatment process, a dry strip processes, a dry etch process, a deposition process or other process.

At (408), the method can include transferring, with the workpiece handling robot a plurality of workpieces to a transfer position. Workpiece handling robot 150 can transfer two workpieces to processing station 122 and processing station 124 respectively in process chamber 120. In some embodiments, the workpiece handling robot 150 can transfer workpieces to a workpiece column 160 located at a transfer position 162.

At (410), the method can include transferring, with a second workpiece handling robot 190 disposed in the transfer chamber, the plurality of workpieces from the transfer position to at least two processing stations in a third process chamber and/or fourth process chamber. The third process chamber can be disposed in linear arrangement with the first process chamber and the fourth process chamber can be disposed in linear arrangement with the second process chamber. For instance, workpiece handling robot 190 can transfer two workpieces from workpiece column 160 in the transfer position 162 to processing station 172 and processing station 174 respectively in process chamber 170.

At (412) the method can include performing a second treatment process on the plurality of workpieces in the third process chamber and/or fourth process chamber. The third treatment process can include, for instance, an anneal process, a thermal treatment process, a surface treatment process, a dry strip processes, a dry etch process, a deposition process or other process.

At (414), the method can include transferring, by the workpiece handling robot 190, the plurality of workpieces back to the transfer position. For instance, workpiece handling robot 190 can transfer workpieces from the process chamber 170 and/or the process chamber 180 to a workpiece column 160 located at the transfer position 162.

At (416), the method can include transferring the processed workpieces back to the workpiece column in the loadlock chamber. For instance, workpiece handling robot 150 can transfer two workpieces from the first process chamber 120 and/or the second process chamber 130. In some embodiments, workpiece handling robot 150 can transfer two workpieces from the transfer position 162 to the workpiece column in the loadlock chamber. One or more robots located in a front end of the processing system can then transfer to processed workpieces to, for instance, a cassette.

As shown. (404)-(416) can be repeated according to the number of workpieces desired for processing. After the desired number of workpieces have been processed or another trigger condition occurs, the method can include replacing replaceable parts (418) in the processing stations. For example, replaceable parts, such as focus rings, can need to be replaced after exposure to a certain number of processing treatments. Replacing the replaceable parts (418) can be accomplished by way of method 300 provided herein. Accordingly, the present systems and methods allow for the automated processing of workpieces and the automated replacement of replacement parts without having to break the vacuum or alter the process pressure of the system.

Figure 9:
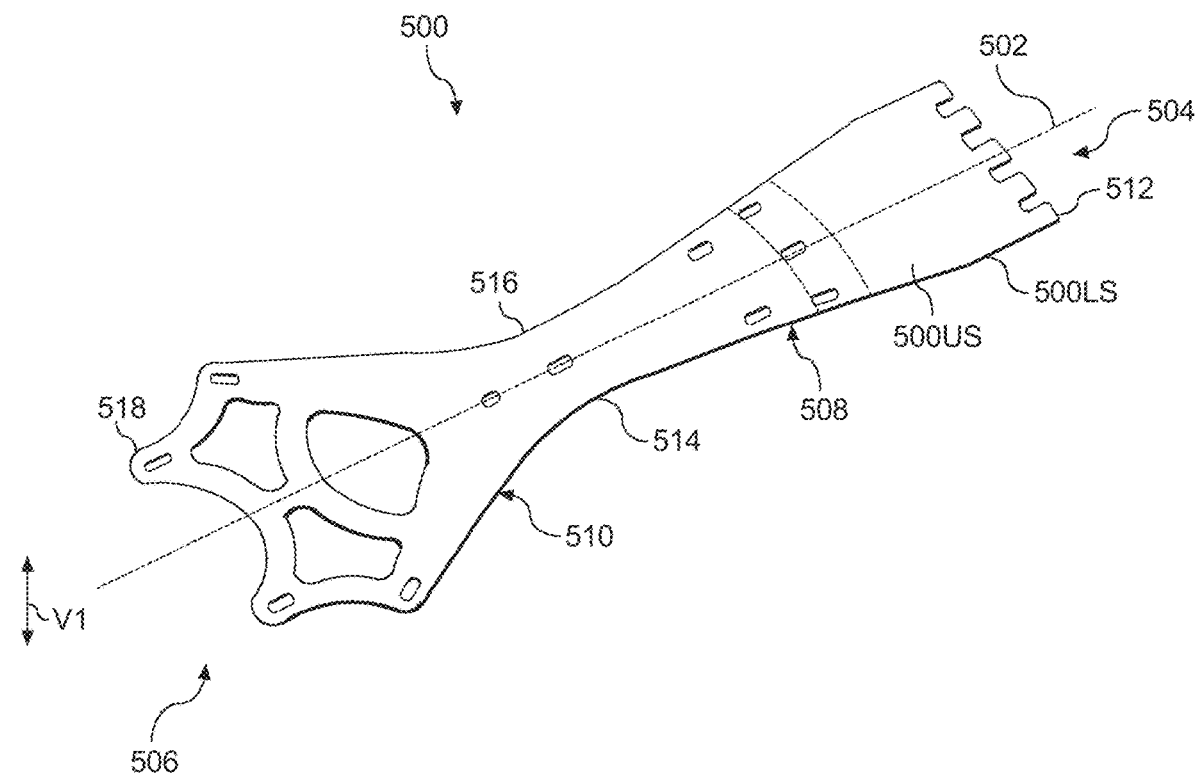
FIG. 9 depicts a perspective view of an example end effector according to example embodiments of the present disclosure.
Figure 10A:
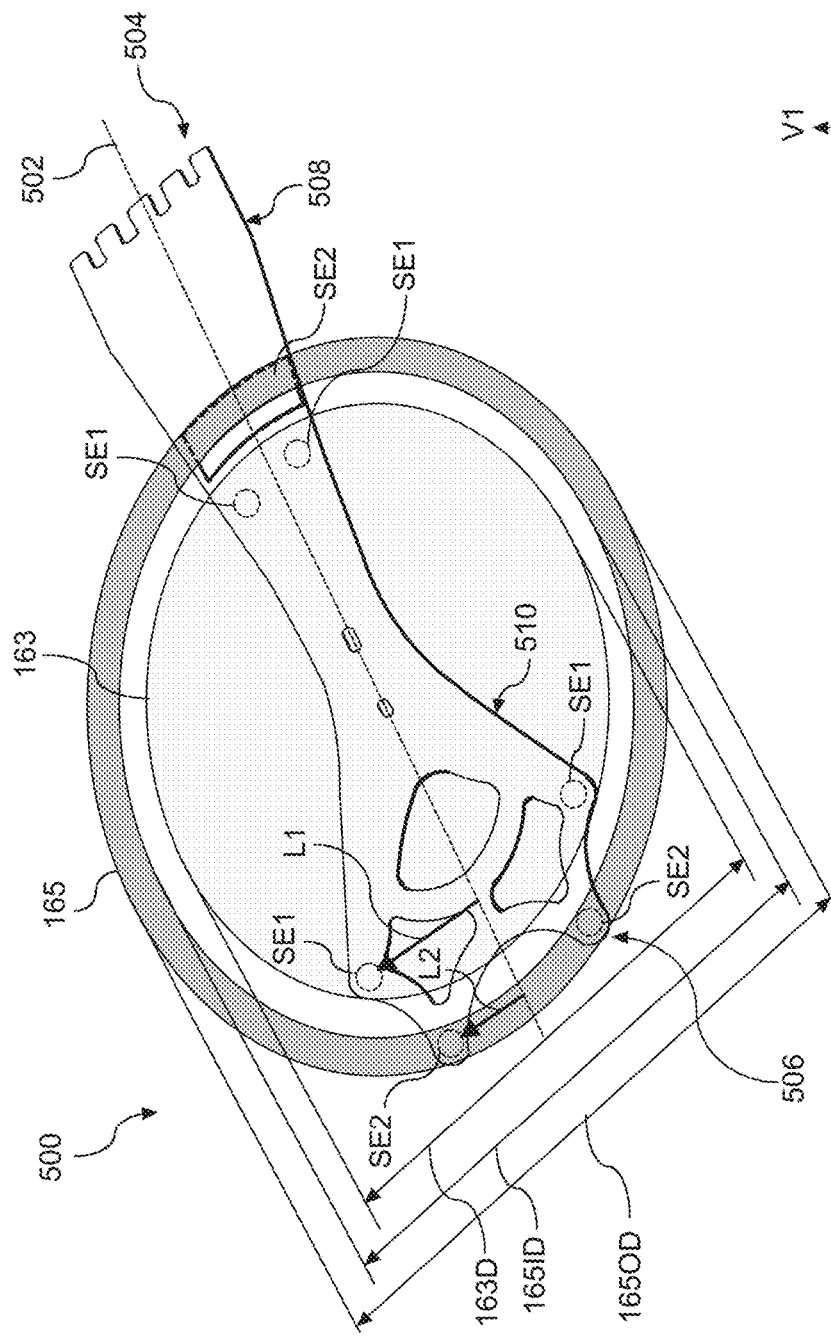
FIG. 10A depicts a perspective view of a first configuration of support elements on the end effector of FIG. 9 for supporting an example workpiece and focus ring according to example embodiments of the present disclosure.
Figure 10B:
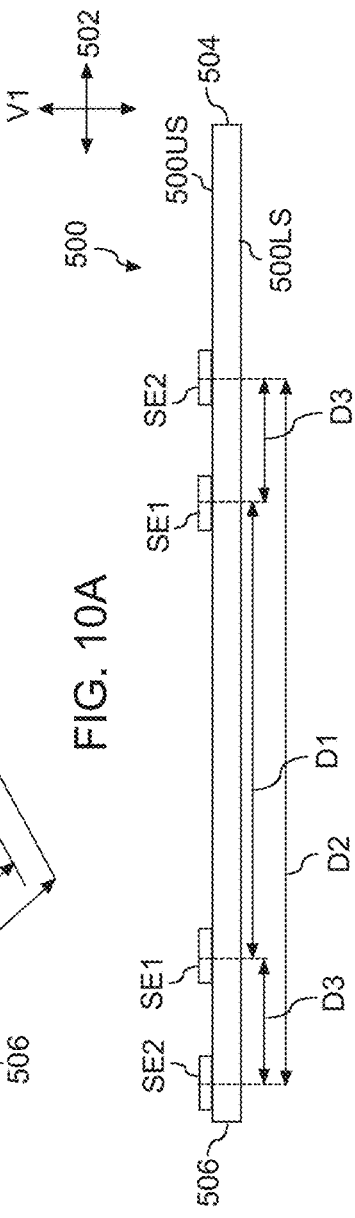
FIG. 10B depicts a side view of the support elements on the end effector shown in FIG. 10A according to example embodiments of the present disclosure.
Figure 11A:
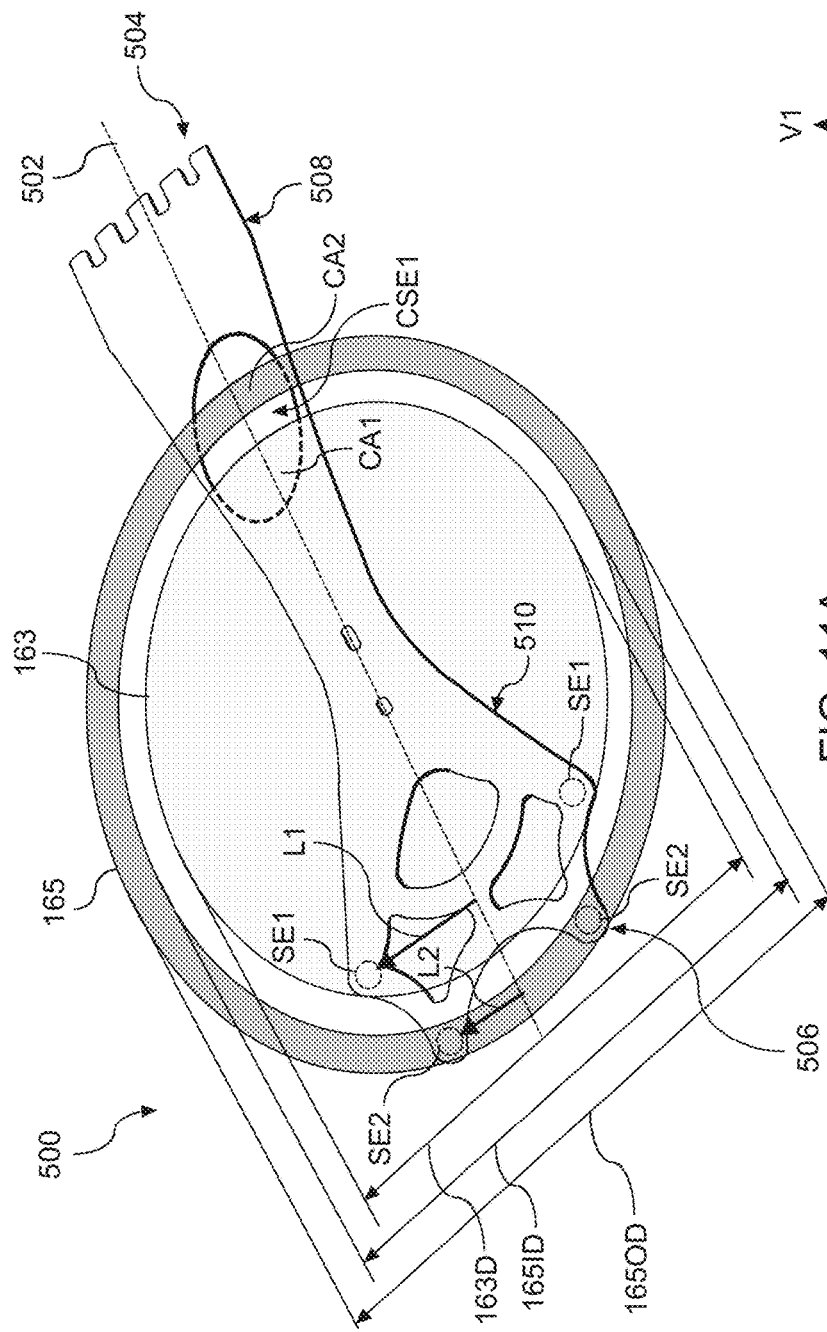
FIG. 11A depicts a perspective view of a second configuration of support elements on the end effector of FIG. 9 for supporting an example workpiece and focus ring according to example embodiments of the present disclosure.
Figure 11B:
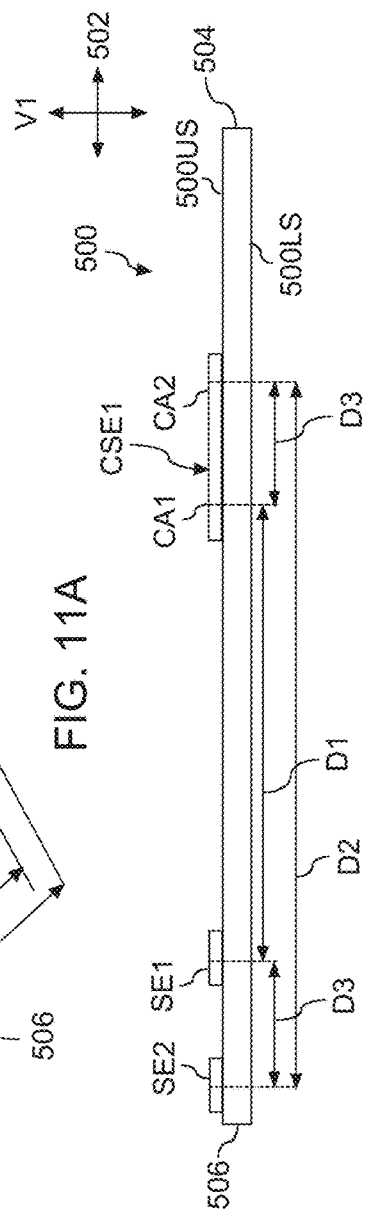
FIG. 11B depicts a side view of the support elements on the end effector shown in FIG. 11A according to example embodiments of the present disclosure.
Figure 12A:
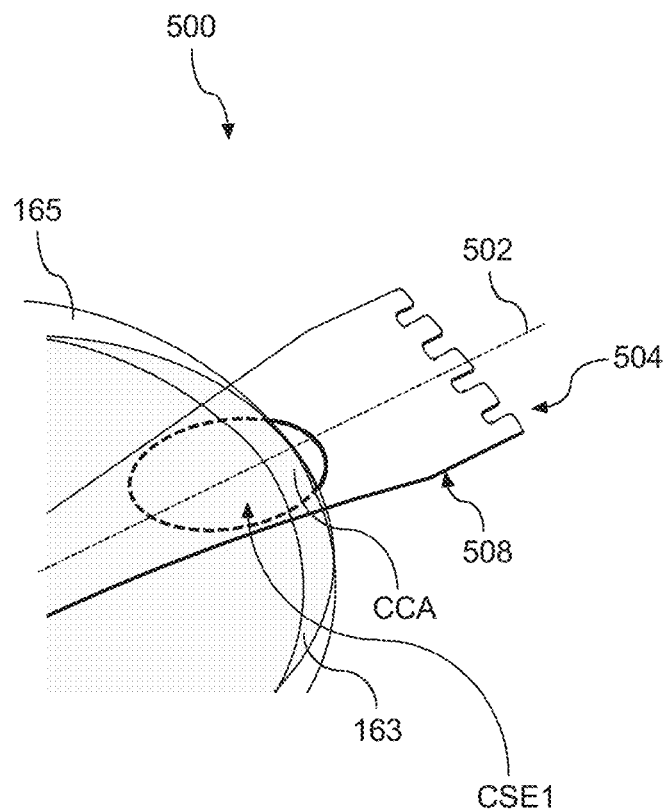
FIG. 12A depicts a partial perspective view of a third configuration of support elements on the end effector of FIG. 9 for supporting an example workpiece and focus ring according to example embodiments of the present disclosure.
Figure 12B:
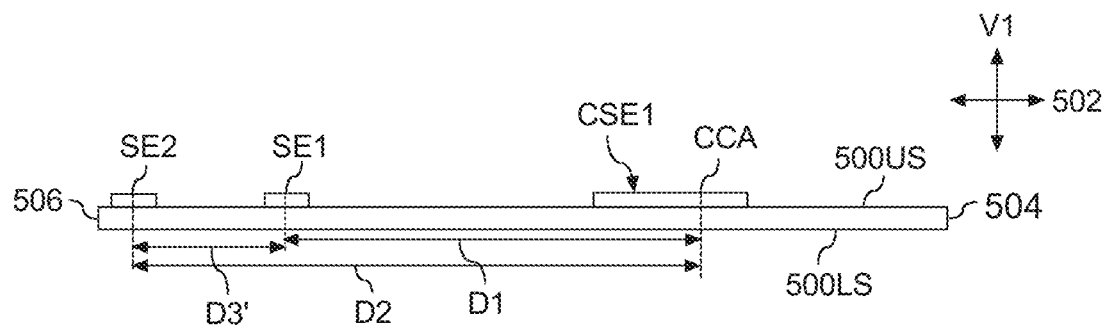
FIG. 12B depicts a side view of the support elements on the end effector shown in FIG. 12A according to example embodiments of the present disclosure.

Turning now to FIGS. 9-12B, example embodiments of an end effector are depicted according to example embodiments of the present disclosure. More particularly, FIG. 9 depicts a perspective view of an example end effector for use within the systems described above. FIGS. 10A-10B depict a first configuration of support elements on the end effector of FIG. 9 for supporting an example workpiece and focus ring. Moreover, FIGS. 11A-11B depict a second configuration of support elements on the end effector of FIG. 9 for supporting an example workpiece and focus ring. Additionally, FIGS. 12A-12B depict a partial perspective view of a third configuration of support elements on the end effector of FIG. 9 for supporting an example workpiece and focus ring.

As shown in FIG. 9, the end effector 500 described above with reference to the system 100, 200 can extend along a longitudinal axis 502 between a proximal end 504 and a distal end 506, and between an upper surface 500US and a lower surface 500LS along a vertical direction V1. The end effector 500 is generally symmetric about the longitudinal axis 502. The end effector 500 includes an arm portion 508 and a spatula portion 510. The arm portion 508 generally extends between a first arm end 512 and a second arm end 514 along the longitudinal axis 502, with the first arm end 512 being at or adjacent to the proximal end 504. Similarly, the spatula portion 510 extends between a first spatula end 516 and a second spatula end 518. The first spatula end 516 is at or adjacent to the second arm end 514 and the second spatula end 518 is at or adjacent to the distal end 506. The end effector 500 is configured to be attached to or otherwise actuatable by a robot (e.g., workpiece handling robot 150, 190) by its arm portion 508, such that the spatula portion 510 can be guided under a raised workpiece or replaceable part (e.g., a focus ring)

In general, the end effector 500 can be configured to separately support workpieces and replaceable parts, where the workpieces have a different diameter than the replaceable parts. For example, as shown in FIGS. 10A, 11A, and 12A, the end effector 500 can be configured to support a workpiece 163 having a diameter 163D and a focus ring 165 having an inner diameter 165ID and an outer diameter 165OD. In some embodiments, the diameter 163D of the workpiece 163 is smaller than the outer diameter 165OD of the focus ring 165. The diameter 163D of the workpiece can be larger than the inner diameter 165ID of the focus ring 165. To keep the workpiece 163 and replaceable part secure when being separately moved by the end effector 500, one or more support pads or elements can be provided on the upper surface of the effector 500.

In one embodiment, such as the embodiment shown in FIGS. 10A and 10B, it is desirable to have separate support elements for workpieces and focus rings to prevent cross-contamination from used focus rings. For example, first support elements SE1 are provided to support the workpiece 163 and second support elements SE2 are provided to support the focus ring 165. At least one of the first support elements SE1 is positioned on the arm portion 508 and at least one other of the first support elements SE1 is positioned on the spatula portion 510. Similarly, at least one of the second support elements SE2 is positioned on the arm portion 508 and at least one other of the second support elements SE2 is positioned on the spatula portion 510. In one embodiment, two separate first support elements SE1 are provided on the arm portion 508 and on the spatula portion 510, where the support elements SE1 are similar or the same in shape. Further, two separate second support elements SE2 are provided on the spatula portion 510 and one elongated second support element SE2 is provided on the arm portion 508. However, any suitable number and shape of support elements SE1, SE2 can instead be provided on the arm portion 508. For instance, one, three, or more first support elements SE1 or two or more second support elements SE2 can be provided on the arm portion 508. Further, the first support element(s) SE1 on the arm portion 508 can instead have an elongated shape like the second support element SE2 shown in FIG. 10A. Additionally, the second support element(s) SE2 on the arm portion 508 can instead have the same shape as the second support element(s) SE2 on the spatula portion 510.

The support elements SE1, SE2 are spaced apart such that the first support elements SE1 can only support workpieces and such that the second support elements SE2 can only support focus rings. For instance, in FIG. 10B, the first support elements SE1 are spaced apart by a distance D1 along the longitudinal axis 502, the second support elements SE2 are spaced apart by a distance D2 along the longitudinal axis 502, and the support elements SE1, SE2 on the arm portion 508 and the support elements SE1, SE2 on the spatula portion 510 are respectively spaced apart by a third distance D3. However, in some embodiments the support elements SE1, SE2 on the arm portion 508 can instead be spaced apart by a different distance than the support elements SE1, SE2 on the spatula portion 510. The distances D1, D2, and D3 are selected such that, when a workpiece is supported on the first support elements SE1, the workpiece does not contact the second support elements SE2. Similarly, when a focus ring is supported on the second support elements SE2, the focus ring does not contact the first support elements SE1, In some embodiments, the second support elements SE2 on the spatula portion 510 are positioned closer to the distal end 506 of the end effector 500 than the first support elements SE1 on the spatula portion 510. Similarly, in one embodiment, the second support elements SE2 on the arm portion 508 are positioned closer to the proximal end 504 of the end effector 500 than the first support elements SE1 on the arm portion 508.

Further, in some embodiments, the first support elements SE1 on the spatula portion 510 are positioned further from the longitudinal axis 502 than the second support elements SE2 on the spatula portion 510. For instance, the first support elements SE1 on the spatula portion 510 are spaced apart from the axis 502 by a first distance L1 in a direction generally perpendicular to the axis 502, and the second support elements SE2 on the spatula portion 510 are spaced apart from the axis 502 by a second distance L2 in the direction generally perpendicular to the axis 502, Where the first distance L1 is greater than the second distance L2.

In another embodiment, such as the embodiment shown in FIGS. 11A and 11B, the risk of cross-contamination between used focus rings and workpieces is relatively low, such that one or more support elements can be configured to support both workpieces and focus rings. For instance, in addition to the first support elements SE1 and the second support elements SE2 on the spatula portion 510, a common or shared support element CSE1 is provided on the arm portion 508. The shared support element CSE1 is configured to, together with the first support elements SE1, support the workpiece 163 and, together with the second support elements SE2, support the focus ring 165.

Similar to FIG. 10B, in FIG. 11B, the first and second support elements SE1, SE2 are spaced apart such that the first support elements SE1 and a first contact area CA1 of the shared support element CSE1 can only support workpieces, and such that the second support elements SE2 and a second contact area CA2 of the shared support element CSE1 can only support focus rings. For example, the first support elements SE1 and the first contact area CA1 are spaced apart by a distance D1 along the longitudinal axis 502, the second support elements SE2 and the second contact area CA2 are spaced apart by a distance D2 along the longitudinal axis 502, and the support elements SE1, SE2 on the arm portion 508 and the contact areas CA1, CA2 on the spatula portion 510 are respectively spaced apart by a third distance D3. However, in sonic embodiments the contact areas CA1, CA2 on the arm portion 508 can instead be spaced apart by a different distance than the support elements SE1, SE2 on the spatula portion 510. The distances D1, D2, and D3 are selected such that, when a workpiece is supported on the first support elements SE1 and the first contact area CA1, the workpiece does not contact the second support elements SE2 or the second contact area CA2. Similarly, when a focus ring is supported on the second support elements SE2 and the second contact area CA2, the focus ring does not contact the first support elements SE1 or the first contact area CA1. As such, the first contact area CA1 for supporting the workpiece 163 is separate from or does not overlap with the second contact area CA2 for supporting the focus ring 165.

As described above, in some embodiments, the second support elements SE2 on the spatula portion 510 are positioned closer to the distal end 506 of the end effector 500 than the first support elements SE1 on the spatula portion 510. Similarly, in one embodiment, the second contact area CA2 is positioned closer to the proximal end 504 of the end effector 500 than the first contact area CA1 of the shared support element CSE1 on the arm portion 508.

Further, in some embodiments, the first support elements SE1 on the spatula portion 510 are positioned further from the longitudinal axis 502 than the second support elements SE2 on the spatula portion 510. For instance, the first support elements SE1 on the spatula portion 510 are spaced apart from the axis 502 by a first distance L1 in a direction generally perpendicular to the axis 502, and the second support elements SE2 on the spatula portion 510 are spaced apart from the axis 502 by a second distance L2 in the direction generally perpendicular to the axis 502, where the first distance L1 is greater than the second distance L2.

Alternatively, in some embodiments, such as the embodiment shown in FIGS. 12A and 12B, the first and second contact areas CA1, CA2 at least partially overlap. For instance, as shown in FIG, 12A, a workpiece and a focus ring separately supported on the end effector 500 are configured to be supported across a common contact area CCA on the shared support element CSE1. For example, as shown in FIG. 12B, the first support elements SE1 and the common contact area CCA are spaced apart by a distance D1 along the longitudinal axis 502, the second support elements SE2 and the common contact area. CCA are spaced apart by a distance D2 along the longitudinal axis 502, and the support elements SET, SE2 on the arm portion 508 are spaced apart by a third distance D3'. The distances D1, D2, and D3' are selected such that, when a workpiece is supported on the first support elements SE1 or a focus ring is supported on the second support elements SE2, the workpiece and the focus ring contact the common contact area CCA. As such, the shared support element CSE1 can be smaller when the common contact area CCA is allowable than if separate contact areas such as the contact areas CA1, CA2) are used.

The embodiment of the end effector 500 shown in FIGS. 12A and 12B can otherwise be configured the same as the embodiment of the end effector 500 shown in FIGS. 11A and 11B. For instance, as described above, in some embodiments, the second support elements SE2 on the spatula portion 510 are positioned closer to the distal end 506 of the end effector 500 than the first support elements SE1 on the spatula portion 510. Further, in some embodiments, the first support elements SE1 on the spatula portion 510 are positioned further from the longitudinal axis 502 than the second support elements SE2 on the spatula portion 510. For instance, the first support elements SE1 on the spatula portion 510 can be spaced apart from the axis 502 by a first distance in a direction generally perpendicular to the axis 502, and the second support elements SE2 on the spatula portion 510 can be spaced apart from the axis 502 by a second distance in the direction generally perpendicular to the axis 502, where the first distance is greater than the second distance.

Figure 13:
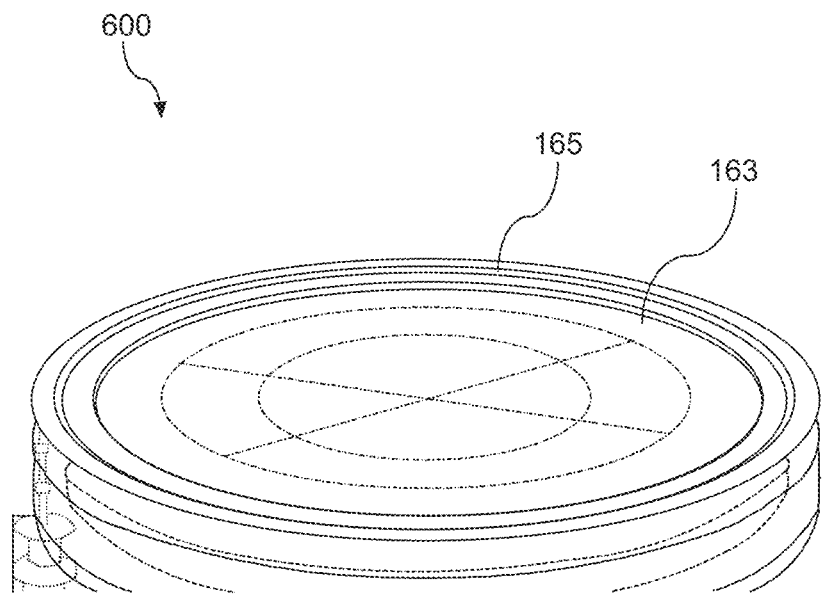
FIG. 13 depicts a perspective view of a focus ring adjustment assembly of an example processing system according to example embodiments of the present disclosure.
Figure 14A:
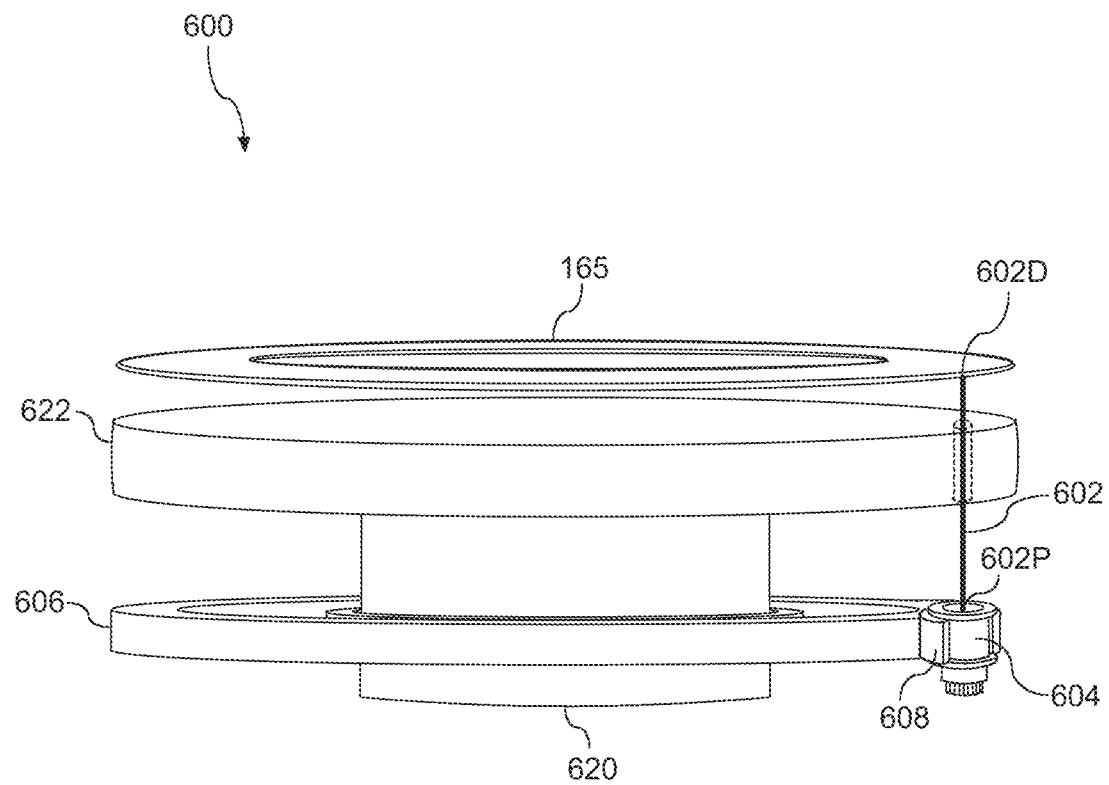
FIG. 14A. depicts a side, sectional view of the adjustment assembly shown in FIG. 13 with a focus ring in a lowered position according to example embodiments of the present disclosure.
Figure 14B:
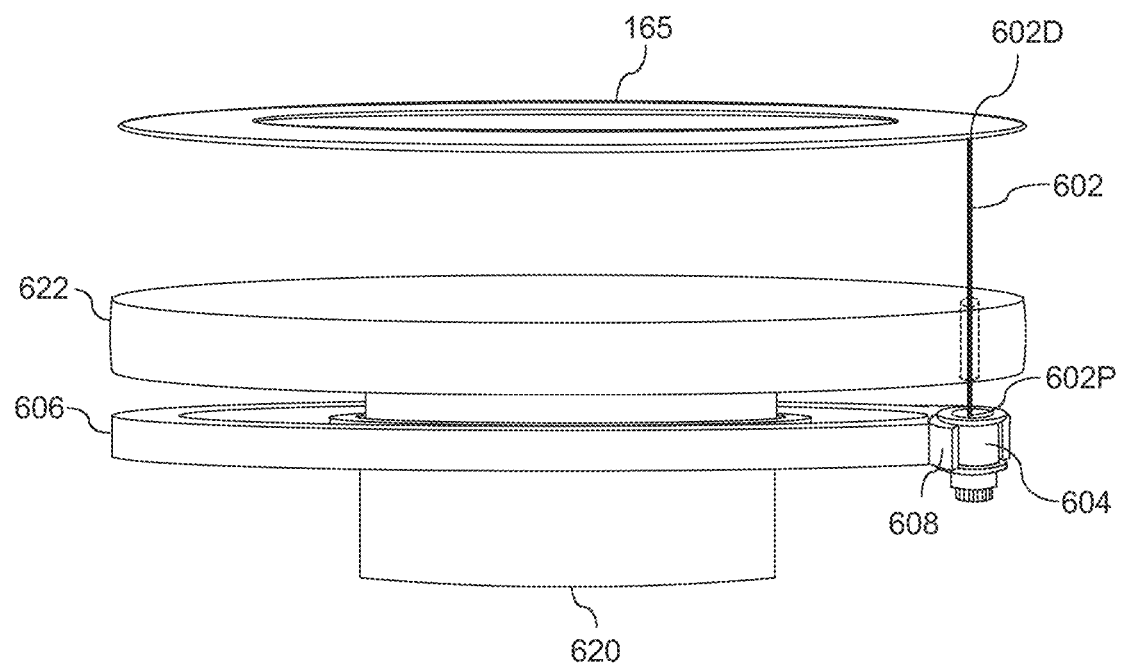
FIG. 14B depicts a side, sectional view of the adjustment assembly shown in FIG. 13 with a focus ring in a raised position according to example embodiments of the present disclosure.
Figure 15A:
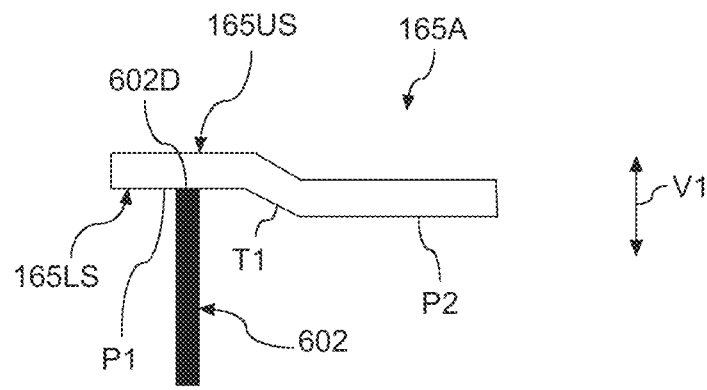
FIG. 15A depicts a section view of a first embodiment of a focus ring for use with the adjustment assembly shown in FIG. 13 according to example embodiments of the present disclosure.
Figure 15B:
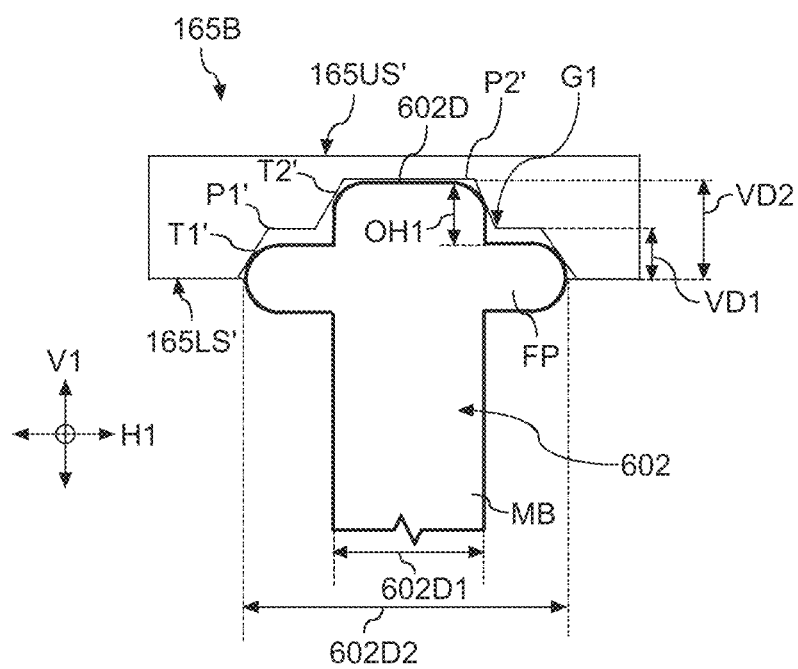
FIG. 15B depicts a section view of a second embodiment of a focus ring for use with the adjustment assembly shown in FIG. 13 according to example embodiments of the present disclosure.
Figure 16:
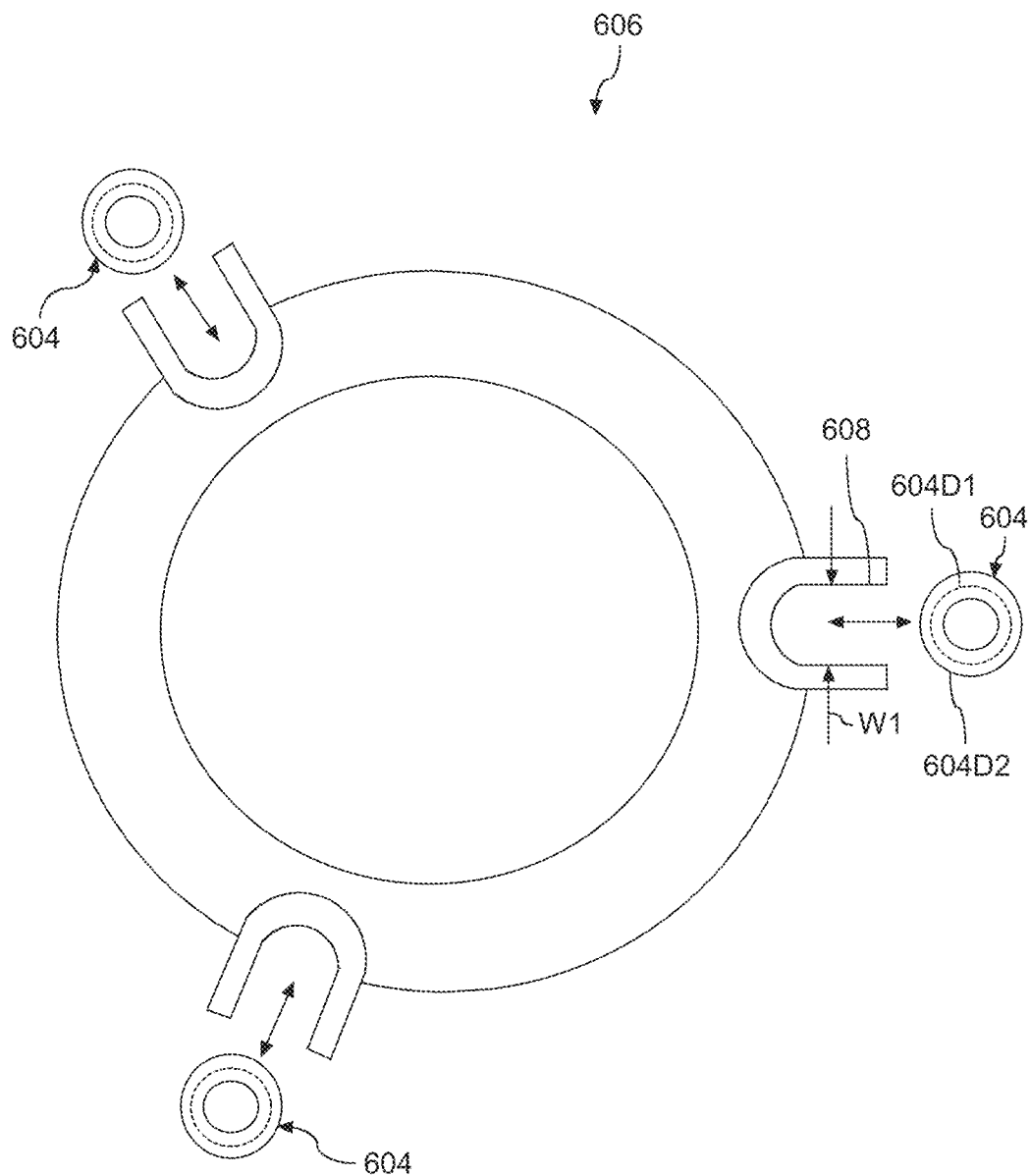
FIG. 16 depicts a top-down view of a pin support plate of the adjustment assembly shown in FIGS. 14A-14B according to example embodiments of the present disclosure.
Figure 17:
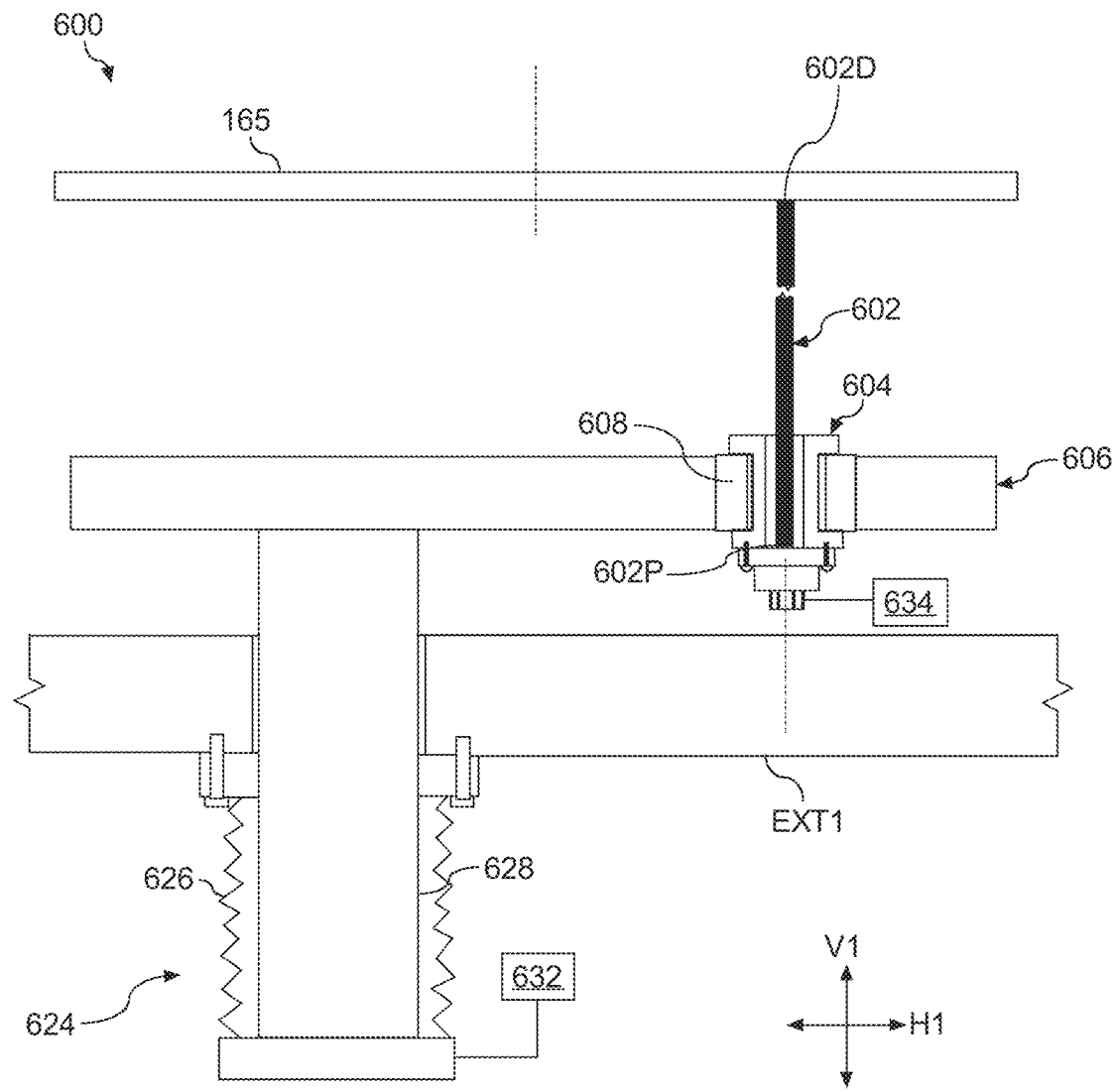
FIG. 17 depicts a schematic view of an actuating system for the adjustment assembly shown in FIGS. 14A-14B according to example embodiments of the present disclosure.

Referring now to FIGS. 13-17, an example embodiment of an adjustment assembly for a workpiece processing station described above is depicted. In particular, FIG. 13 depicts a focus ring adjustment assembly of an example processing system. FIG. 14A depicts a side, sectional view of the adjustment assembly shown in FIG. 13 with a focus ring in a lowered position. Similarly, FIG. 14B depicts a side, sectional view of the adjustment assembly shown in FIG. 13 with a focus ring in a raised position. Additionally, FIG. 15A depicts a section view of a first embodiment of a focus ring for use with the adjustment assembly shown in FIG. 13 and. FIG. 15B depicts a section view of a second embodiment of a focus ring for use with the adjustment assembly shown in FIG. 13. Moreover, FIG. 16 depicts a top-down view of a pin support plate of the adjustment assembly shown in FIGS. 14A-14B. Additionally, FIG. 17 depicts a schematic view of an actuating system for the adjustment assembly shown in FIGS. 14A-14B according to example embodiments of the present disclosure.

As described above, a workpiece processing system (e.g., system 100, 200) includes a. workpiece support(s) (e.g., station 122, 124, 132, 134) within a process chamber (e.g., 120, 130, 170, 180) that is configured to support a workpiece (e.g., workpiece 113, 163) during a process treatment step(s). As shown in FIG. 13, a focus ring 165 is positioned around a periphery or outer diameter of a workpiece supported on a workpiece support 163. The focus ring 165 can be used, for instance, to shape the plasma in the vicinity of the workpiece. During plasma processing in a plasma processing chamber, the focus ring 165 can he exposed to plasma and as such is exposed to deposition and erosion. As a result, the focus ring 165 can need to be periodically replaced in the plasma processing chamber as part of preventative maintenance. A focus ring adjustment assembly 600 is provided that allows the focus ring 165 to be moved between a working or processing position, in which it is not easily accessible for removal from the process chamber, and one or more raised positions. In at least one of the raised positions, the focus ring is more easily accessible for removal from the process chamber.

The focus ring adjustment assembly 600 includes a plurality of pins for supporting the focus ring. For instance, as shown in FIGS. 14A and 14B, the focus ring 165 is supported by pins 602 (only one of which is shown). Each pin 602 extends between a proximal end 602P and a distal end 602D, where the distal end 602D is configured to contact the focus ring 165. As will be described below in greater detail, the pins 602 can be configured to selectively contact a portion of the focus ring 165 (e.g., in a groove) such that lateral movement of the ring 165 on the pins 602 is at least partially prevented or reduced. The assembly 600 further includes a lifting mechanism which can be used to raise or lower the pins 602 to raise the focus ring 165 from a processing position to a raised position or lower the focus ring 165 into a processing position, respectively. In the processing position, the pins 602 may no longer contact the focus ring and the focus ring 165 may be supported by a pedestal (e.g., step structure in the pedestal). As will be described in greater detail below, the assembly 600 further includes floating couplings 604 slidably received within a pin support plate 606, where the proximal end 602P of each pin 602 is coupled to a respective one of the floating couplings 604, and where the pin support plate 606 is movable to raise or lower the pins 602, In one embodiment, as shown in FIG. 15A, the focus ring 165A has a stepped cross-sectional profile. More particularly, the focus ring 165A extends between an upper side 165US and a lower side 165LS along the vertical direction V1, where the lower side 165LS has a first surface portion P1, a second surface portion P2, and a transition portion T1 between the first and second surface portions P1, P2. The first surface portion P1 is vertically above the second surface portion P2. In some embodiments, the first surface portion P1 is radially outside of the second surface portion P2. The distal end 602D of the pin 602 is configured to selectively contact the first surface portion P1 (e.g., one or more grooves in the first surface portion P1) such that the focus ring 165A is prevented from laterally sliding and becoming at least partially unseated from the pins 602. Additionally, the first surface portion P1 is generally planar such that the distal end 602D of the pin 602 makes full contact with the first surface portion P1 (e.g., one or more grooves or slots in the first surface portion P1).

In some embodiments, the focus ring has three backside radial slots to receive the pin(s) 602. This configuration can fix the position of the focus ring 165A, allowing for accurate centering of the focus ring on to the pedestal and can also prevent lateral movement. The backside radial slots can also allow for thermal expansion of the focus ring while being supported by the pins 602. In some embodiments, the focus ring can include a backside annular groove. The backside annular groove extends annularly around the backside surface of the focus ring. The backside annular groove can include an outer diameter and an inner diameter. The pin(s) 602 may be configured to contact the outer diameter. During thermal expansion of the focus ring, the pin(s) 602 may no longer contact the outer diameter but my slide radially in the groove in a direction towards the inner diameter to accommodate thermal expansion of the focus ring.

In some embodiments, as shown in FIG. 15B, the focus ring 165B has a grooved cross-sectional profile. More particularly, the focus ring 165B extends between an upper side 165US' and a lower side 165LS' along the vertical direction V1, and between an inner surface 165IS' and an outer surface 165OS' along a radial direction, where a groove G1 is recessed into the lower side 165LS' such that it is spaced apart from the inner and outer surfaces 165IS', 165OS'. The groove G1 can be an annular groove that extends all the way annularly around the focus ring 165B. The distal end 602D of the pin 602 is configured to selectively contact at least a portion of the groove G1. The groove G1 defines a first groove portion extending a first distance VD1 from the lower side 165LS' and a second groove portion extending a second distance VD2 from the lower side 165LS'. The second distance VD2 is less than a thickness of the focus ring 165B defined between the upper and lower sides 165US', 165LS' along the vertical direction V1. A first surface portion P1' is positioned at the first distance VD1 from the lower side 165LS', a second surface portion P2' is positioned at the second distance VD2 from the lower side 165LS', a first transition portion T1' extends between the first surface portion P1' and the lower side 165LS', and a second transition portion T2' extends between the first and second surface portions P1', P2'. The second surface portion P2' is vertically above the first surface portion P1'. The distal end 602D of the pin 602 is configured to selectively contact at least one of the second surface portion P2' or the second transition portion T2'. The second surface portion P2' is generally planar such that the distal end 602D of the pin 602 can fully contact the second surface portion P2'. Further, in some embodiments, the pin 602 has a main body portion MB extending between its proximal and distal ends 602P, 602D and a flange portion FP extending outwardly from the main body portion MB at a distance OH1 offset from the distal end 602D, The flange portion FP has a diameter 602D2 that is greater than the diameter 602D1 of the main body portion MB of the pin 602. The flange portion FP is configured to contact at least one of the first surface portion P1' or the first transition portion T1'. As such, the focus ring 165B is prevented from laterally sliding and becoming at least partially unseated from the pin 602.

Additionally, or alternatively, in some embodiments, the shape of the groove G1 of the focus ring 165B, the shape of the pin(s) 602, or both are configured such that rotation of the pin(s) 602 secures or fixes the focus ring 165B to the pin(s) 602. For instance, rotation of the pin(s) 602 through a predetermined locking angle can fix the focus ring 165B to the pin(s) 602.

A top down view of a suitable pin support plate is shown in FIG. 16. The pin support plate 606 has a plurality of floating coupling slots 608 circumferentially spaced apart around the perimeter of the pin support plate 606. The slots 608 extend generally radially outwardly from the outer perimeter of the plate 606. However, in some embodiments, the slots 608 can extend radially inwardly from the inner perimeter of the plate 606. Each floating coupling slot 608 is configured to receive a respective one of the floating couplings 604. For example, each floating coupling slot 608 has a slot width W1 which is greater than the outer diameter 604D1 of the floating couplings 604, but smaller than the outer diameter 604D2 of a flange portion of the floating couplings 604, which extends outwardly from the outer diameter 604D1 of the floating couplings 604. As such, the flange portion of the floating coupling 604 can rest on an upper face of the floating coupling slot 608 when installed within the floating coupling slot 608. Such floating coupling slot 608 can thus, allow the pins 602 to move slightly in a horizontal plane laterally along an x-axis and/or a y-axis relative to the focus ring 165 or workpiece support.

The pin support plate 606 is configured to be actuated between a lowered position and one or more raised positions such that the focus ring 165 is respectively moved between processing position to one or more raised positions. For instance, as shown in FIG. 14A, the pin support plate 606 is in its lowered position relative to a main support post 620 fixed within the process chamber and a support ring 622 fixed to the main support post 620. In such lowered position of the pin support plate 606, the pins 602 supported on the pin support plate 606 by the floating couplings 604 are in their retracted positions such that the focus ring 165 is in its processing position and is supported by the workpiece support. In some embodiments, the pins 602 can be movable by the pin support plate 606 such that the pins 602 do not touch the focus ring 165 when in their retracted positions. However, in other embodiments, the pins 602 can remain in contact with the focus ring 165 when in their retracted positions.

The pin support plate 606 is movable, as will be described in greater detail below, into its raised position shown in FIG. 14B relative to the main support post 620 and support ring 622. The pin support plate 606 is vertically higher along the vertical direction in its raised position than in its lowered position. As the pin support plate 606 is moved into such raised position, the pins 602 supported on the pin support plate 606 by the floating couplings 604 are moved along the vertical direction into their extended positions such that the focus ring 165 is moved into its raised position above the workpiece support. The focus ring 165 is positioned vertically higher along the vertical direction V1 when the pins 602 are in their extended positions than when the pins 602 are in their retracted positions. Once in a raised position, an end effector (e.g., the end effector 500) can easily be placed under the focus ring 165 for lifting the focus ring 165 from the one or more pins 602 and out of the chamber.

As shown in FIG. 17, the assembly 600 further includes a plate actuator 624 for moving the pin support plate 606. The plate actuator 624 is positioned exterior to the process chamber and is vacuum sealed. More particularly, the plate actuator 624 has a vacuum sealed housing 626 that is coupled to an exterior wall EXT1 of the process chamber and a connection shaft 628 that extends within the vacuum sealed housing 626 through the exterior wall EXT1 of the process chamber. The connection shaft 628 supports the pin support plate 606 and is movable relative to the exterior wall EXT1 by an actuator mechanism 632. The actuator mechanism 632 is configured to move the connection shaft 628 between a first position along the vertical direction associated with the pin support plate 606 being in the lowered position, and a second position along the vertical direction associated with the pin support plate 606 being in the raised position, and/or one or more different vertical positions. The actuator mechanism 632 can be configured as any suitable actuator for moving the connection shaft 628 between the first and second positions. For instance, in some embodiments, the actuator mechanism 632 is configured as a linear actuator, a rotary actuator, and or the like. By positioning the actuator mechanism 632 exterior to the process chamber, the mechanism 632 can be serviced or replaced without needing to affect the vacuum of the process chamber.

The focus rings 165 can be configured to be installed in the chamber with a particular azimuthal orientation relative to the workpiece support. Typically, the focus rings 165 are positioned in a storage chamber (e.g., storage chamber 250) to have the proper azimuthal orientation when removed from the storage chamber for installation within the process chamber. However, in some embodiments, it is desirable to further adjust the azimuthal position of the focus rings 165. In such embodiments, the storage chamber and/or end effector for moving the focus rings 165 can include one or more features for adjusting an azimuthal position of a focus ring 165.

Figure 18:
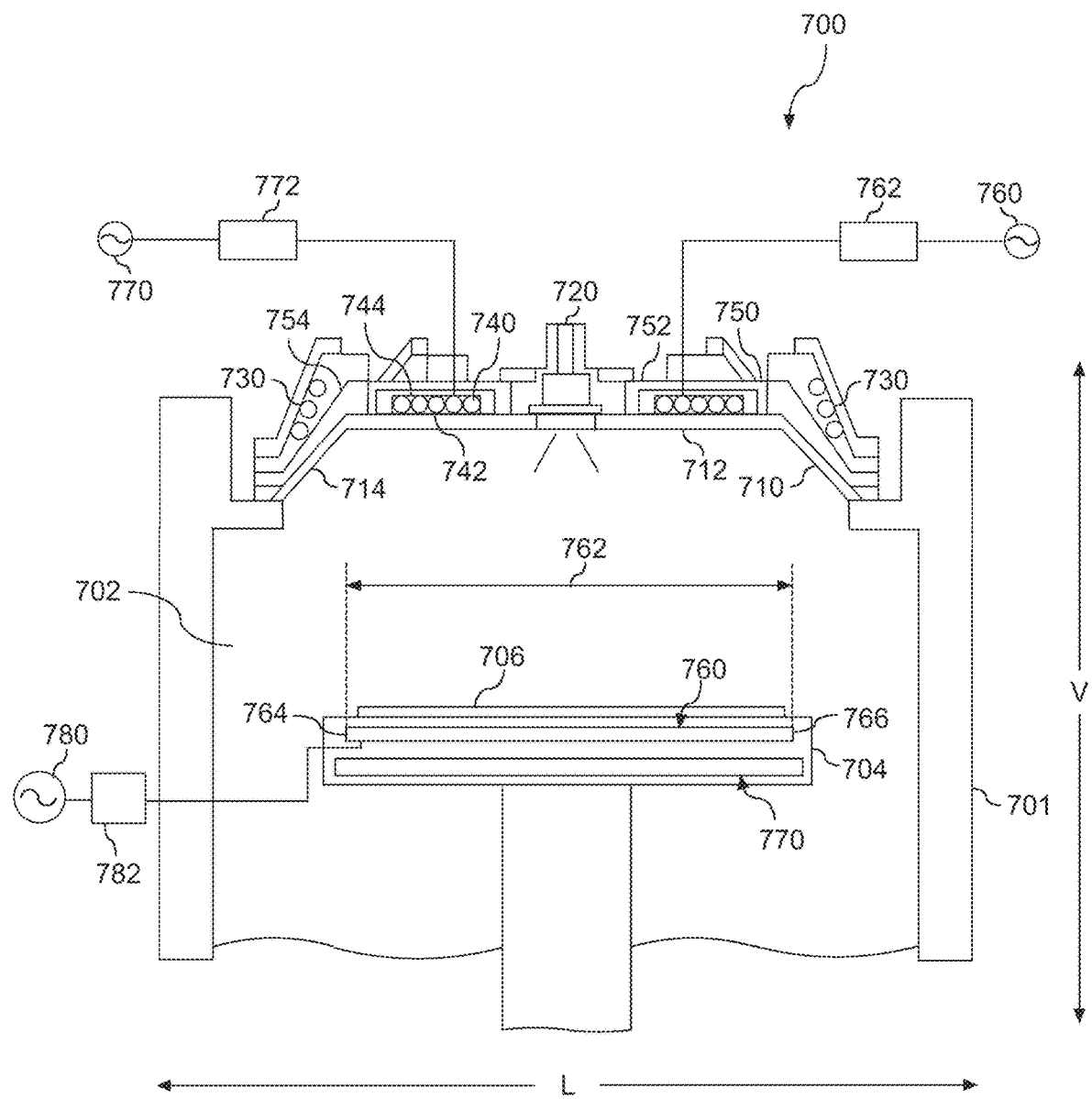
FIG. 18 depicts a plasma processing apparatus according to example embodiments of the present disclosure.

Referring now to FIG. 18, a plasma processing apparatus 700 is provided according to example embodiments of the present disclosure. The plasma processing apparatus 700 can include a processing chamber 701 defining a vertical direction V and a lateral direction L. The plasma processing apparatus 700 can include a pedestal 704 disposed within an interior space 702 of the processing chamber 701. The pedestal 704 can be configured to support a substrate 706, such as a semiconductor wafer, within the interior space 702. A dielectric window 710 is located above the pedestal 704 and acts as a ceiling of the interior space 702. The dielectric window 710 includes a central portion 712 and an angled peripheral portion 714. The dielectric window 710 includes a space in the central portion 712 for a showerhead 720 to feed process gas into the interior space 702.

In some implementations, the plasma processing apparatus 700 can include a plurality of inductive elements, such as a primary inductive element 730 and a secondary inductive element 740, for generating an inductive plasma in the interior space 702. The primary inductive element 730 and the secondary inductive element 740 can each include a coil or antenna element that when supplied with RF power, induces a plasma in the process gas in the interior space 702 of the processing chamber 701. For instance, a first RF generator 760 can be configured to provide electromagnetic energy through a matching network 762 to the primary inductive element 730. A second RF generator 770 can be configured to provide electromagnetic energy through a matching network 772 to the secondary inductive element 740.

While the present disclosure makes reference to a primary inductive element and a secondary inductive element, those of ordinary skill in the art, should appreciate that the terms primary and secondary are used for convenience purposes only. The secondary coil can be operated independently of the primary coil. The primary coil can be operated independently of the secondary coil. In addition, in some embodiments, the plasma processing apparatus can only have a single inductive coupling element.

In some implementations, the plasma processing apparatus 700 can include a metal shield 752 disposed around the secondary inductive element 740. In this manner, the metal shield 752 separates the primary inductive element 730 and the secondary inductive element 740 to reduce cross-talk between the primary inductive element 730 and the secondary inductive element 740.

In some implementations, the plasma processing apparatus 700 can include a first Faraday shield 754 disposed between the primary inductive element 730 and the dielectric window 710. The first Faraday shield 754 can be a slotted metal shield that reduces capacitive coupling between the primary inductive element 730 and the process chamber 701. As illustrated, the first Faraday shield 754 can fit over the angled portion of the dielectric window 710.

In some implementations, the metal shield 752 and the first Faraday shield 754 can form a unitary body 750 for ease of manufacturing and other purposes. The multi-turn coil of the primary inductive element 730 can be located adjacent the first Faraday shield 754 of the unitary body 750. The secondary inductive element 740 can be located proximate the metal shield 752 of the unitary body 750, such as between the metal shield 752 and the dielectric window 710.

The arrangement of the primary inductive element 130 and the secondary inductive element 140 on opposite sides of the metal shield 752 allows the primary inductive element 730 and secondary inductive element 740 to have distinct structural configurations and to perform different functions. For instance, the primary inductive element 730 can include a multi-turn coil located adjacent a peripheral portion of the process chamber 701. The primary inductive element 730 can be used for basic plasma generation and reliable start during the inherently transient ignition stage. The primary inductive element 730 can be coupled to a powerful RF generator and expensive auto-tuning matching network and can be operated at an increased RF frequency, such as at about 13.56 MHz. As used herein, the term "about" refers to a range of values within 20 percent of a stated numerical value.

In some implementations, the secondary inductive element 740 can be used for corrective and supportive functions and for improving the stability of the plasma during steady state operation. Furthermore, since the secondary inductive element 740 can be used primarily for corrective and supportive functions and improving stability of the plasma during steady state operation, the secondary inductive element 740 does not have to be coupled to as powerful an RF generator as the primary inductive element 730 and can therefore be designed differently and cost effectively to overcome the difficulties associated with previous designs. As discussed in detail below, the secondary inductive element 740 can also be operated at a lower frequency, such as at about 2 MHz, allowing the secondary inductive element 740 to be very compact and to fit in a limited space on top of the dielectric window.

In some implementations, the primary inductive element 730 and the secondary inductive element 740 can be operated at different frequencies. The frequencies can be sufficiently different to reduce cross-talk in the plasma between the primary inductive element 730 and the secondary inductive element 740. For instance, the frequency applied to the primary inductive element 730 can be at least about 1.5 times greater than the frequency applied to the secondary inductive element 740. In some embodiments, the frequency applied to the primary inductive element 730 can be about 13.56 MHz and the frequency applied to the secondary inductive element 740 can be in the range of about 1.75 MHz to about 2.15 MHz. Other suitable frequencies can also be used, such as about 400 kHz, about 4 MHz, and about 27 MHz. While the present disclosure is discussed with reference to the primary inductive element 730 being operated at a higher frequency relative to the secondary inductive element 740, those of ordinary skill in the art, using the disclosures provided herein, should understand that the secondary inductive element 740 could be operated at the higher frequency without deviating from the scope of the present disclosure.

In some implementations, the secondary inductive element 740 can include a planar coil 742 and a magnetic flux concentrator 744. The magnetic flux concentrator 744 can be made from a ferrite material. Use of a magnetic flux concentrator with a proper coil can give high plasma coupling and good energy transfer efficiency of the secondary inductive element 740 and can significantly reduce its coupling to the metal shield 752. Use of a lower frequency, such as about 2 MHz, on the secondary inductive element 740 can increase skin layer, which also improves plasma heating efficiency.

In some implementations, the primary inductive element 730 and the secondary inductive element 740 can carry different functions. For instance, the primary inductive element 730 can he used to carry out the basic functions of plasma generation during ignition and providing enough priming for the secondary inductive element 740. The primary inductive element 730 can have coupling to both plasma and the grounded shield to stabilize plasma potential. The first Faraday shield 754 associated with the primary inductive element 730 avoids window sputtering and can be used to supply the coupling to the grounded shield.

Additional coils can be operated in the presence of good plasma priming provided by the primary inductive element 730 and as such, preferably have good plasma coupling and good energy transfer efficiency to plasma. A secondary inductive element 740 that includes a magnetic flux concentrator 744 provides both a good transfer of magnetic flux to plasma volume and at the same time a good decoupling of the secondary inductive element 740 from the surrounding metal shield 752. The magnetic flux concentrator 744 and symmetric driving of the secondary inductive element 740 further reduces the amplitude of the voltage between coil ends and surrounding grounded elements. This can reduce sputtering of the dome, but at the same time gives some small capacitive coupling to plasma, which can be used to assist ignition. In some implementations, a second Faraday shield can be used in combination with this secondary inductive element 740 to reduce capacitive coupling of the secondary inductive element 740.

In some implementations, the plasma processing apparatus 700 can include a radio frequency (RF) bias electrode 760 disposed within the processing chamber 701. The plasma processing apparatus 700 can further include a ground plane 770 disposed within the processing chamber 701 such that the ground plane 770 is spaced apart from the RF bias electrode 760 along the vertical direction V. As shown, the RF bias electrode 760 and the ground plane 770 can, in some implementations, be disposed within the pedestal 704.

In some implementations, the RF bias electrode 760 can be coupled to a RF power generator 780 via a suitable matching network 782. When the RF power generator 780 provides RF energy to the RF bias electrode 760, a plasma can be generated from a mixture in the processing chamber 701 for direct exposure to the substrate 706. In some implementations, the RF bias electrode 760 can define a RF zone 762 that extends between a first end 764 of the RF bias electrode 760 and a second end 766 of the RF bias electrode 760 along the lateral direction L. For instance, in some implementations, the RF zone 762 can span from the first end 764 of the RF bias electrode 760 to the second end 766 of the RF bias electrode 760 along the lateral direction L. The RF zone 762 can further extend between the RF bias electrode 760 and the dielectric window 710 along the vertical direction V.

It should be understood that a length of the ground plane 770 along the lateral direction L is greater than a length of the RF bias electrode 760 along the lateral direction L. In this manner, the ground plane 770 can direct RF energy towards emitted by the RF bias electrode 760 towards the substrate 706.

Figure 19:
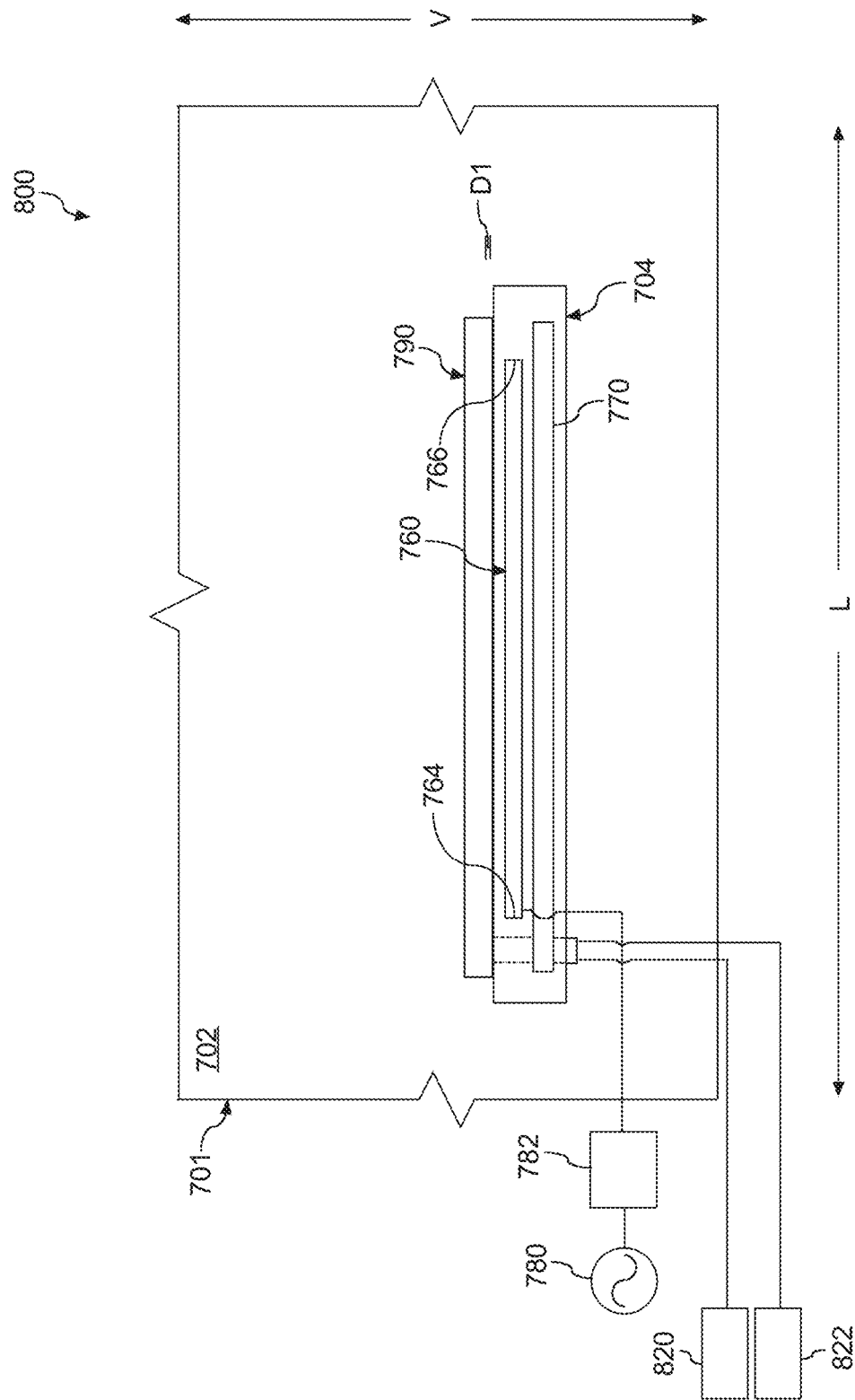
FIG. 19 depicts a focus ring adjustment assembly holding a focus ring of a plasma processing apparatus in a first position according to example embodiments of the present disclosure.
Figure 20:
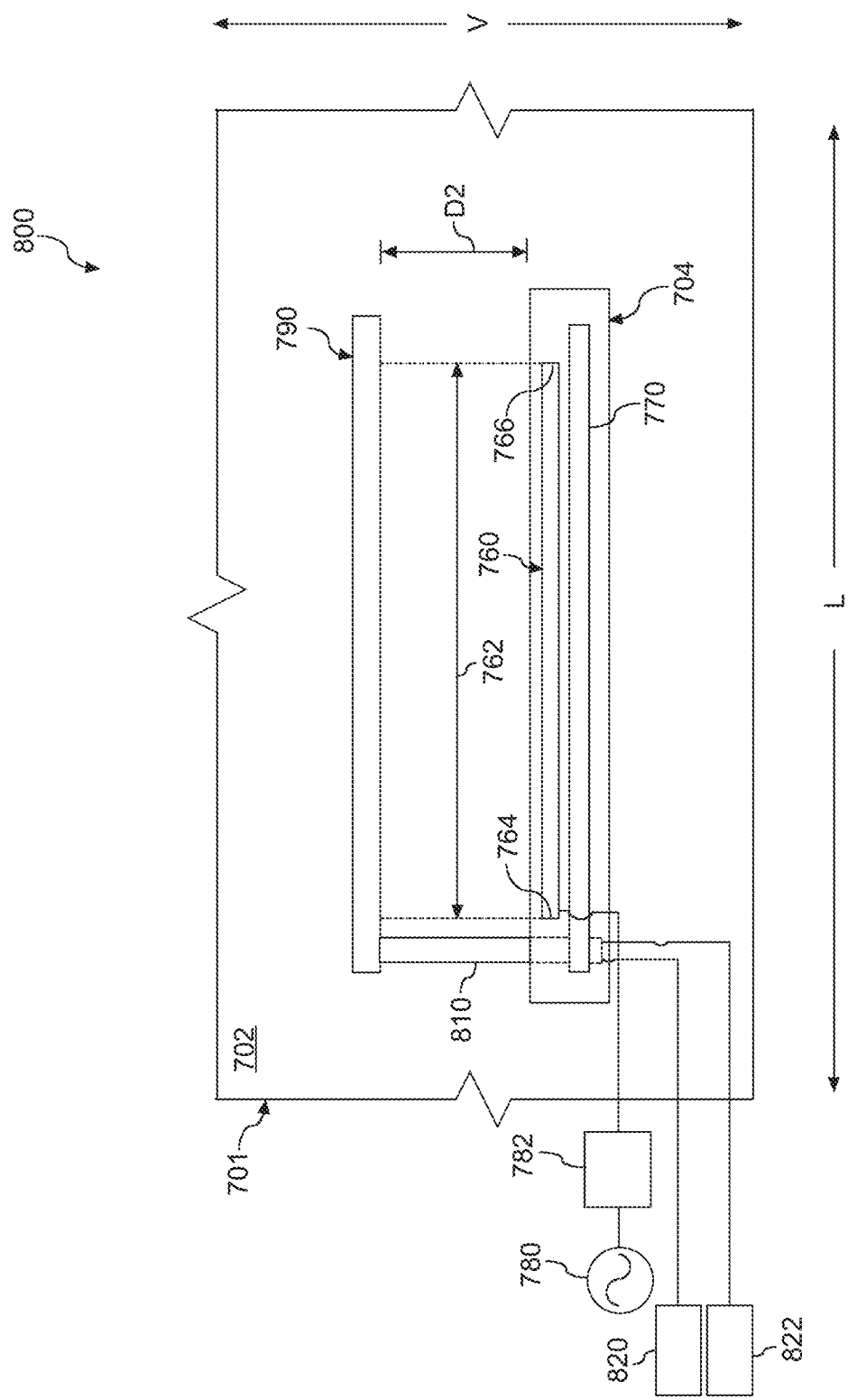
FIG. 20 depicts a focus ring adjustment assembly holding a focus ring of a plasma processing apparatus in a second position according to example embodiments of the present disclosure.

Referring now to FIGS. 19 and 20, a focus ring adjustment assembly 800 for a focus ring 790 of the plasma processing apparatus 700 (FIG. 18) is provided according to example embodiments of the present disclosure. As shown, the focus ring adjustment assembly 800 can include a lift pin 810 movable along the vertical direction V to move the focus ring 790 between at least a first position (FIG. 19) and a second position (FIG. 20) to adjust a distance between the focus ring 790 and the pedestal 704 along the vertical direction V. For instance, the focus ring 790 can be spaced apart from the pedestal 704 by a first distance D1 (e.g., zero or very close to zero such that the focus ring is supported on the pedestal 704) when the focus ring 790 is in the first position (FIG. 19). Furthermore, the focus ring 790 can be spaced apart from the pedestal 704 by a second distance D2 when the focus ring 790 is in the second position (FIG. 20). As shown, the second distance D2 can be different than the first distance D1. In particular, the second distance D2 can be greater than the first distance D1. In this manner, the focus ring adjustment assembly 800, specifically the pin 810 thereof, can move the focus ring 790 from the first position (FIG. 19) to the second position (FIG. 20) to facilitate removal of the focus ring 790 from the processing chamber 701 using, for instance, the end effector discussed above with reference to FIGS. 9 through 12B.

As shown, the lift pin 810 can be positioned outside of the RF zone 762 defined by the RF bias electrode 760. Furthermore, the lift pin 810 can penetrate the ground plane 770. For instance, in some implementations, the lift pin 810 can extend through an opening defined by the ground plane 770. It should be understood that locating the lift pin 810 outside of the RF zone 762 and additionally having the lift pin 810 penetrate the ground plane 770 can reduce arcing risks associated with applying RF power (e.g. bias power) from the RF power generator 780 to the RF bias electrode 760 during a plasma process. Furthermore, interference (e.g., electrical and mechanical) between the lift pin 810 and the focus ring 790 can be reduced.

In some implementations, the focus ring adjustment assembly 800 can include an actuator 820 configured to move the lift pin 810 along the vertical direction V to facilitate movement of the focus ring 790 between at least the first position (FIG. 19) and the second position (FIG. 20). As shown, the actuator 820 can be positioned outside of the processing chamber 701. Additionally, the focus ring adjustment assembly 800 can include a second actuator 822 configured to rotate the lift pin 810 about the vertical direction V. As shown, the second actuator 822 can be positioned outside of the processing chamber 701.

While the present subject matter has been described in detail with respect to specific example embodiments thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A focus ring adjustment assembly of a system for processing workpieces under vacuum in a vacuum process chamber, a focus ring extending along a vertical direction between an upper side and a lower side, the lower side having a first surface portion and a second surface portion, the first surface portion being vertically above the second surface portion, the focus ring adjustment assembly comprising:
   a pin extending between a proximal end and a distal end, the distal end being configured to selectively contact the first surface portion of the focus ring;
   an actuator operable to move the pin along the vertical direction between an extended position and a retracted position;
   a support plate movable along the vertical direction between a raised position and a lowered position; and
   a floating coupling fixed to the proximal end of the pin, the floating coupling being slidably supported by the support plate such that the floating coupling is movable relative the support plate in a horizontal direction,
   wherein the actuator is configured to move the support plate along the vertical direction between the raised position and the lowered position to move the pin between the extended position and the retracted position, the raised position of the support plate being associated with the extended position of the pin and the lowered position of the support plate being associated with the retracted position of the pin, and
   wherein the extended position of the pin is associated with the distal end of the pin contacting the first surface portion of the focus ring, and the focus ring being accessible for removal by a workpiece handling robot from the vacuum process chamber.

2. The adjustment assembly of claim 1, wherein the focus ring is positioned vertically higher along the vertical direction when the pin is in the extended position relative to when the pin is in a retracted position.

3. The adjustment assembly of claim 1, wherein the focus ring comprises a backside annular groove.

4. The adjustment assembly of claim 1, further comprising a rotary actuator configured to selectively rotate the pin, wherein rotation of the pin through a predefined locking angle secures the focus ring to the pin.

5. The adjustment assembly of claim 1, wherein the pin has a main body portion and a flange portion, the main body portion extending between the proximal end and the distal end, the flange portion being spaced apart from the distal end of the pin and extending outwardly from the main body portion,
   wherein the flange portion is configured to contact a transition surface portion positioned vertically between the first surface portion and the second surface portion of the focus ring when the distal end of the pin is contacts the first surface portion of the focus ring.

6. The adjustment assembly of claim 1, wherein the actuator is vacuum sealed, the actuator being positioned exterior to the vacuum process chamber, the actuator being coupled to the support plate via a connection shaft extending through an exterior wall of the vacuum process chamber.

7. A focus ring adjustment assembly of a system for processing workpieces under vacuum in a vacuum process chamber, a focus ring extending between an upper side and a lower side along a vertical direction, the focus ring having a groove recessed inwardly from the lower side towards the upper side, the focus ring adjustment assembly comprising:
   a pin extending between a proximal end and a distal end, the distal end being configured to selectively contact the groove;
   an actuator operable to move the pin along the vertical direction between an extended position and a retracted position;
   a support plate movable along the vertical direction between a raised position and a lowered position; and
   a floating coupling fixed to the proximal end of the pin, the floating coupling being slidably supported by the support plate such that the floating coupling is movable relative the support plate in a horizontal direction,
   wherein the actuator is configured to move the support plate along the vertical direction between the raised position and the lowered position to move the pin between the extended position and the retracted position, the raised position of the support plate being associated with the extended position of the pin and the lowered position of the support plate being associated with the retracted position of the pin, and
   wherein the extended position of the pin is associated with the distal end of the pin contacting the groove, and the focus ring being accessible for removal from the vacuum process chamber by a workpiece handling robot.

8. The adjustment assembly of claim 7, wherein the focus ring extends between an inner surface and an outer surface along a radial direction, the groove being spaced apart from the inner and outer surfaces.

9. The adjustment assembly of claim 7, wherein the groove has a first groove portion and a second groove portion, the first groove portion extending from the lower side of the focus ring to a first distance from the lower side, the second groove portion extending from the first distance to a second distance from the lower side, the second distance being less than a thickness of the focus ring between the upper and lower sides along the vertical direction.

10. The adjustment assembly of claim 9, wherein the pin has a main body portion and a flange portion, the main body portion extending between the proximal and distal ends, the flange portion being spaced apart from the distal end of the pin and extending outwardly from the main body portion, wherein the flange portion is configured to be at least partially received within the first groove portion, and the portion of the pin extending between the flange portion and the distal end being at least partially received within the second groove portion.

11. The adjustment assembly of claim 7, wherein the focus ring is positioned vertically higher along the vertical direction when the pin is in the extended position relative to when the pin is in the retracted position.

12. The adjustment assembly of claim 7, wherein the focus ring comprises a backside annular groove.

13. The adjustment assembly of claim 7, wherein the actuator is vacuum sealed, the actuator being positioned exterior to the vacuum process chamber, the actuator being coupled to the support plate via a connection shaft extending through the exterior wall of the vacuum process chamber.

* * * * *